(12) United States Patent
Fukunaga et al.

(10) Patent No.: US 6,871,773 B2
(45) Date of Patent: *Mar. 29, 2005

(54) COMPOSITE METALLIC ULTRAFINE PARTICLES AND PROCESS FOR PRODUCING THE SAME

(75) Inventors: Akira Fukunaga, Tokyo (JP); Hiroshi Nagasawa, Tokyo (JP); Kaori Kagoshima, Tokyo (JP); Makiko Emoto, Tokyo (JP)

(73) Assignee: Ebara Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/804,085

(22) Filed: Mar. 19, 2004

(65) Prior Publication Data

US 2004/0173666 A1 Sep. 9, 2004

Related U.S. Application Data

(62) Division of application No. 09/811,581, filed on Mar. 20, 2001, now Pat. No. 6,743,395.

(30) Foreign Application Priority Data

| Mar. 22, 2000 | (JP) | ........................................ | 2000-080445 |
| Jun. 9, 2000 | (JP) | ........................................ | 2000-174331 |
| Oct. 4, 2000 | (JP) | ........................................ | 2000-305209 |

(51) Int. Cl.[7] .......................... B23K 31/02; C22F 32/00
(52) U.S. Cl. ..................................... 228/122.1; 419/23
(58) Field of Search ............................ 228/122.1, 202; 419/10, 23, 28

(56) References Cited

U.S. PATENT DOCUMENTS

| 3,814,696 A | 6/1974 | Verdone et al. |
| 4,186,244 A | 1/1980 | Deffeyes et al. |
| 4,680,204 A | 7/1987 | Das et al. |
| 5,147,841 A | 9/1992 | Wilcoxon |
| 5,314,541 A | 5/1994 | Saito et al. |
| 5,328,681 A | 7/1994 | Kito et al. |
| 5,679,059 A | 10/1997 | Nishi et al. |
| 5,683,501 A | 11/1997 | Tomihisa et al. |
| 5,912,257 A | 6/1999 | Prasad et al. |
| 5,980,636 A | 11/1999 | Okumura |
| 5,993,546 A | 11/1999 | Sugai |
| 6,054,507 A | 4/2000 | Funaki |

(Continued)

FOREIGN PATENT DOCUMENTS

| EP | 0 449 309 A2 | 10/1991 |
| EP | 0 740 324 A2 | 10/1996 |
| EP | 0 960 675 | 12/1999 |
| EP | 1107298 A2 | 6/2001 |
| EP | 1 107 298 A1 | 6/2001 |
| JP | 5 156324 | 6/1993 |
| JP | 8 150559 | 6/1996 |
| JP | 10 200236 | 7/1998 |
| JP | 11 060581 | 3/1999 |
| JP | 11 204473 | 7/1999 |
| JP | 10 183207 | 12/1999 |
| JP | 2000 39737 A | 2/2000 |
| JP | 2002 363127 A | 12/2002 |
| WO | WO 98/26889 | 6/1998 |

Primary Examiner—L. Edmondson
(74) Attorney, Agent, or Firm—Browdy and Neimark, P.L.L.C.

(57) ABSTRACT

The present invention relates to composite metallic ultrafine particles which have excellent dispersion stability and can be produced on an industrial scale, and a process for producing the same, and a method and an apparatus for forming an interconnection with use of the same. A surface of a core metal produced from a metallic salt, a metallic oxide, or a metallic hydroxide and having a particle diameter of 1 to 100 nm is covered with an organic compound including a functional group having chemisorption capability onto the surface of the core metal.

4 Claims, 13 Drawing Sheets

U.S. PATENT DOCUMENTS

| | | |
|---|---|---|
| 6,080,670 A | 6/2000 | Miller et al. |
| 6,103,868 A | 8/2000 | Heath et al. |
| 6,139,591 A | 10/2000 | Nakaura et al. |
| 6,231,834 B1 | 5/2001 | Unger et al. |
| 6,235,224 B1 | 5/2001 | Mathiowitz et al. |
| 6,262,129 B1 | 7/2001 | Murray et al. |
| 6,272,768 B1 | 8/2001 | Danese |
| 6,346,741 B1 | 2/2002 | Van Buskirk et al. |
| 6,358,611 B1 | 3/2002 | Nagasawa et al. |
| 6,369,206 B1 | 4/2002 | Leone et al. |
| 6,503,831 B2 | 1/2003 | Speakman |
| 6,743,395 B2 * | 6/2004 | Fukunaga et al. ............ 419/23 |
| 2002/0160103 A1 | 10/2002 | Fukunaga et al. |
| 2002/0177143 A1 | 11/2002 | Mirkin et al. |
| 2003/0039860 A1 | 2/2003 | Cheon et al. |

* cited by examiner

F I G. 1
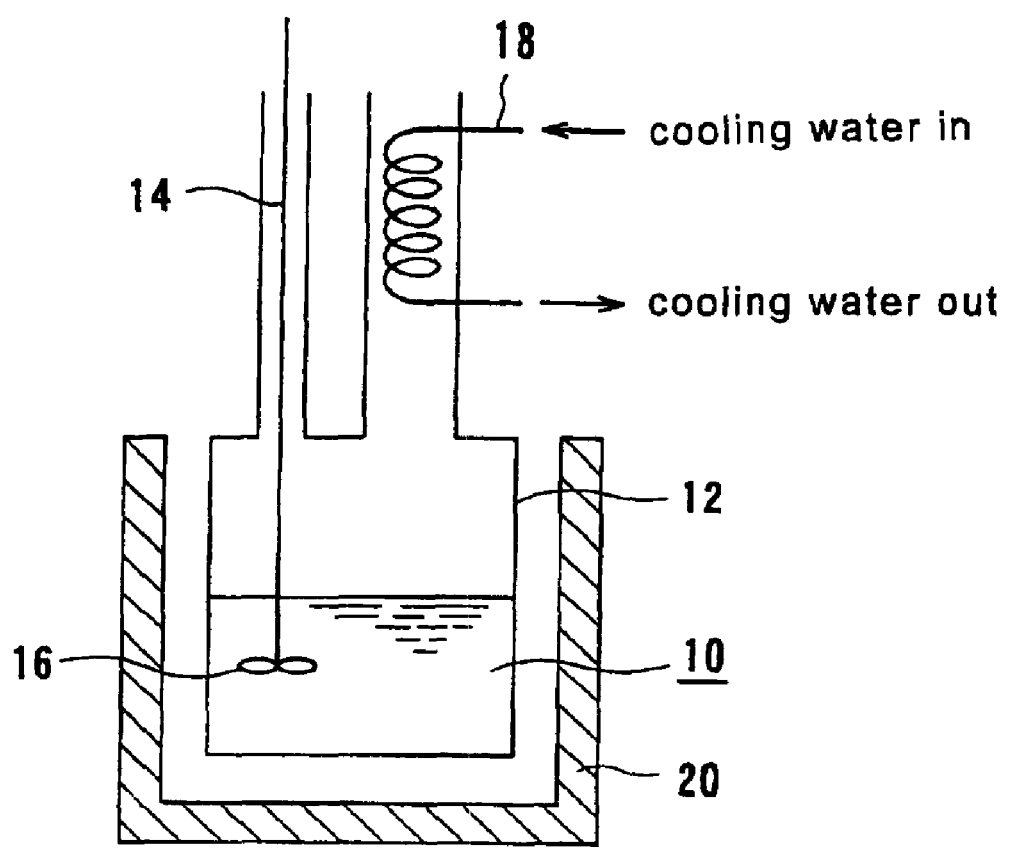

organic compound including alcohol hydroxyl group

COMPOSITE METALLIC ULTRAFINE PARTICLES AND PROCESS FOR PRODUCING THE SAME This is a division of parent application Ser. No. 09/811,581, filed Mar. 20, 2001, now U.S. Pat. No. 6,743,395.

BACKGROUND OF THE INVENTION

1. Field of the Invention

The present invention relates to composite metallic ultrafine particles and a process for producing the same, and more particularly to composite metallic ultrafine particles which have excellent dispersion stability and can be produced on an industrial scale, and a process for producing the same, and a method and an apparatus for forming an interconnection with use of the same.

2. Description of the Related Art

Generally, as a process for producing metallic ultrafine particles having a diameter of not more than 100 nm, there has been known a process in which metal is evaporated under vacuum in the presence of a small amount of gas, and then metallic ultrafine particles are condensed from the vapor phase to obtain ultrafine metallic particulates. However, this physical process suffers from practical problems that ① the variation in the particle diameter distribution is so large that even if a heating process is performed for film formation, grain boundaries are left, and a uniform metallic film cannot be obtained, ② the amount of metallic ultrafine particles produced in a single operation is so small that this process is not suitable for mass production, and ③ devices for an electron beam, plasma, laser, induction heating, or the like are necessary for the evaporation of metal, and hence the production cost rises, for example.

Further, when the metallic ultrafine particles are solely taken out into the air, they are agglomerated. Therefore, it is necessary to disperse the particles in a solvent with use of a surface-active agent or the like. However, since the dispersion stability is poor, the storage stability is unsatisfactory.

There has been reported a method for producing metallic ultrafine particles in which metal ions produced from a metallic salt in an aqueous solvent are stabilized by a polymeric protective agent. However, such metallic ultrafine particles are limited to being handled in an aqueous system and thus have poor flexibility. Further, in this case, a high-molecular weight dispersant should be used for stabilization of metallic ultrafine particles. Therefore, metal content is lowered, and the ultrafine particles have little expectation of using as a metal source.

Metallic ultrafine particles have high activity and are unstable. Therefore, when such metallic ultrafine particles are gathered in a bare particle state, the particles are easily adhered to each other to cause an agglomeration or to be chained. In order to stabilize metallic ultrafine particles in such a state that the particles are separated from each other, it is necessary to form a certain protective coating on the surface of the metallic ultrafine particles. Further, in order that metallic ultrafine particles are stable as particles even with a high metal content, a metallic core should be stably bonded to the protective coating formed therearound.

When the production of metallic ultrafine particles on an industrial scale is taken into consideration, metallic ultrafine particles should preferably be safety and simply produced in a production process, and such metallic ultrafine particles are required to be utilized in various fields and to have good flexibility.

The present inventors have found the following thing. A certain metallic salt, a metallic oxide, or a metallic hydroxide is mixed with an organic compound including a functional group having chemisorption capability onto a metal produced from the metallic salt, the metallic oxide, or the metallic hydroxide. In a process in which the mixture is heated under the reflux condition of the organic compound for reaction, a core of an ultrafine particle of pure metal is produced by pyrolysis of the metallic salt, the metallic oxide, or the metallic hydroxide. The organic compound is chemisorbed onto the core by the functional group of the organic compound to form composite metallic ultrafine particles having a stable protective coating with high efficiency.

Further, it has been found that since a metallic salt, a metallic oxide, or a metallic hydroxide as a metal source and an organic compound for a protecting coating are different from each other, there is a possibility that the metal content, the reactivity, the particle diameter, or the like of the composite metallic ultrafine particles to be produced can be controlled by varying the combination of the metal source with the organic compound. Further, since the amount ratio of the metal source to the organic compound can also be manipulated as desired, processes from synthesis to purification of the composite metallic ultrafine particles can easily be optimized.

The present inventors have found that, in a process in which a certain metallic salt is mixed with an organic compound including an alcoholic hydroxyl group and pyrolyzed, an alcohol is bonded to the periphery of a core metal with a metal alkoxide bond to form composite metallic ultrafine particles having a stable protective coating. Further, the present inventors have invented a novel method for forming an interconnection on a semiconductor substrate with use of this composite metallic ultrafine particle, and an apparatus using this method.

SUMMARY OF THE INVENTION

The present invention has been made in view of the above circumstances. It is therefore an object of the present invention to provide composite metallic ultrafine particles which have more uniform particle diameters and have excellent dispersion stability and enhanced stability in the properties of particles, and a process for producing composite metallic ultrafine particles which can produce such composite metallic ultrafine particles simply and stably on an industrial scale.

According to a first embodiment of a composite metallic ultrafine particle of the present invention, there is provided a composite metallic ultrafine particle characterized in that a surface of a core metal produced from a metallic salt, a metallic oxide, or a metallic hydroxide and having a particle diameter of 1 to 100 nm is covered with an organic compound including a functional group having chemisorption capability onto the surface of the core metal.

It has been known that that the melting point of metallic particles lowers as the particle diameter decreases. This effect appears when the particle diameter is not more than 100 nm, and becomes significant when the particle diameter is 1 to 18 nm. When the particle diameter is 1 to 10 nm, some metals begin to melt even at around ordinary temperature. Therefore, the average particle diameter of the core metal (metallic ultrafine particle) is preferably 1 to 50 nm, and more preferably 1 to 18 nm, and, particularly, more preferably 1 to 10 nm. Further, the surface of the core metal is stably covered with the organic compound strongly chemisorbed onto the surface of the core metal with a chemical bonding strength. This organic compound serves as a protective coating for protecting the core metal, for thereby improving dispersion stability in a solvent and stability in the properties of particles. As the particle diameter of the core metal decreases, the proportion of the protective coating relatively increases to lower the metal content. Therefore, for some applications, it is not advisable to excessively reduce the particle diameter of the metal portion.

Here, chemisorption capability refers to formation of chemical bond only to the surface of the object without involving any further reaction. Thus, chemisorption capability is different from chemical reaction which implies reaction with the surface of the object so as to cut the bond between the surface atoms and the inside of the object material and to finally remove the surface atoms from the surface of the object.

Specifically, for example, in the case of copper, when a carboxylic acid is used as a protective group, as shown in the following scheme, the carboxylic acid is chemisorbed on the surface of copper at a low temperature, and, at a certain high temperature, a reaction occurs to disadvantageously remove surface atoms of copper and to form a copper salt of the carboxylic acid. This is considered attributable to the fact that, at such a high temperature, the carboxylic acid-copper bonding strength is stronger than the copper-copper bonding strength. Thus, in this case, the decomposition effect is superior to the protective effect, and, accordingly, when ultrafine particles of copper have been formed, even when copper ultrafine particles are formed, they are immediately decomposed to a copper salt of the carboxylic acid.

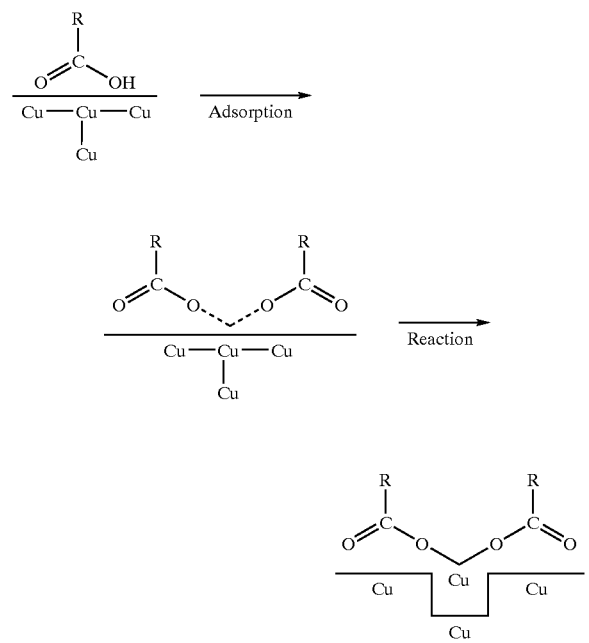

On the other hand, for example, when a higher alcohol having five or more carbon atoms is used as a protective group, as shown in the following scheme, the alcohol is chemisorbed onto the surface of copper to form a monomolecular layer, which, even under considerably high temperature conditions, causes no more reaction and can serve as a protective layer, because the reactivity of the higher alcohol is not as high as that of the carboxylic acid.

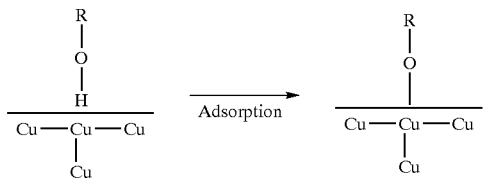

In the case of silver, both of the carboxylic acid and the higher alcohol have relatively low chemical reactivity compared with stability of silver. Hence, when the carboxylic acid and the higher alcohol are used as a protective group, these compounds are chemisorbed onto the surface of silver with no more reaction with silver. According to the present application, as described above, a combination of a metallic salt, a metallic oxide, or a metallic hydroxide as a metal source with an organic compound for the protective coating can be selected as desired. Therefore, as exemplified above, the protective coating can be optimized according to the properties of the selected metal.

As the core metal, there may be used at least one member selected from the group consisting of Ag, Au, Bi, Co, Cu, Cr, Fe, Ge, In, Ir, Ni, Os, Pd, Pt, Rh, Ru, Si, Sn, Ti, and V, for example. It is desirable that the amount of organic compound for covering the core metal is 0.01 to 1 molecule, per metal atom on the surface of the core metal.

As the organic compound, there may be used an alcoholic hydroxyl group, carboxyl, thiol, amino, or amide group which has four or more carbon atoms.

As the metallic salt, there may be used carbonate, nitrate, chloride, acetate, formate, citrate, oxalate, urate, phthalate, or a fatty acid salt having four or less carbon atoms.

According to a first embodiment of a process for producing composite metallic ultrafine particles of the present invention, there is provided a process for producing composite metallic ultrafine particles, characterized by comprising: mixing a metallic salt, a metallic oxide, or a metallic hydroxide with an organic compound including a functional group having chemisorption capability onto a surface of a core metal produced from the metallic salt, the metallic oxide, or the metallic hydroxide; and heating the mixture for reaction.

According to a second embodiment of a process for producing composite metallic ultrafine particles of the present invention, there is provided a process for producing composite metallic ultrafine particles, characterized by comprising: mixing a metallic salt, a metallic oxide, or a metallic hydroxide with an organic compound including a functional group having chemisorption capability onto a surface of a core metal produced from the metallic salt, the metallic oxide, or the metallic hydroxide; and heating the mixture under a reflux condition of the organic compound for reaction.

The above composite metallic ultrafine particles can be produced in a chemical process, and, therefore, can be mass-produced with use of a simple apparatus, without use of a large vacuum apparatus, in a usual atmospheric atmosphere. This contributes to lowered cost.

According to a second embodiment of a composite metallic ultrafine particle of the present invention, there is provided a composite metallic ultrafine particle having a structure in which a periphery of a core metal having a diameter of 1 to 100 nm is surrounded by an organic compound including an alcoholic hydroxyl group.

It has been known that that the melting point of metallic particles lowers as the particle diameter decreases. This effect appears when the particle diameter is not more than 100 nm, and becomes significant when the particle diameter is not more than 20 nm. The melting point is largely lowers when the particle diameter is not more than 10 nm. Therefore, from the viewpoint of use, the average particle diameter of the core metal (metallic ultrafine particle) is preferably 1 to 20 nm, and more preferably 5 to 15 nm. Further, the organic compound including an alcoholic hydroxyl group serves as a protective coating for protecting the core metal. It is advantageous, for example, in that, in use of the metallic ultrafine particles, the composite metallic ultrafine particles can easily be decomposed at a low temperature without significant obstruction by the protective coating. Furthermore, this can improve dispersion stability in a solvent and stability in the properties of particles.

The organic compound including an alcoholic hydroxyl group may be a straight-chain or branched-chain alcohol having four or more carbon atoms, or an aromatic compound including a hydroxyl group.

According to a third embodiment of a process for producing composite metallic ultrafine particles of the present invention, there is provided a process for producing composite metallic ultrafine particles, characterized by comprising heating an organic compound including an alcoholic hydroxyl group and a metallic salt as a metal source at a temperature that is not more than a decomposition initiation temperature of the organic compound including an alcoholic hydroxyl group and is not less than a decomposition temperature of the metallic salt.

According to a fourth embodiment of a process for producing composite metallic ultrafine particles of the present invention, there is provided a process for producing composite metallic ultrafine particles, characterized in that: a reducing agent, such as acetaldehyde, propionaldehyde, or ascorbic acid, in addition to an organic compound including an alcoholic hydroxyl group is added to a metallic salt as a metal source, and the mixture is heated to reduce the metallic salt.

The metal source may be at least one member selected from the group consisting of Cu, Ag, Au, In, Si, Ti, Ge, Sn, Fe, Co, Ni, Ru, Rh, Pd, Os, Ir, Pt, V, Cr, and Bi.

The above composite metallic ultrafine particles can be produced in a chemical process in a liquid phase, and, therefore, can be mass-produced with use of a simple apparatus, without use of a large vacuum apparatus. This contributes to lowered cost. Further, since the composite metallic ultrafine particles can be produced at a low temperature, energy consumption can be reduced to contribute lowered cost. Furthermore, since the raw materials used are harmless to the environment, the composite metallic ultrafine particles can safely be produced on an industrial scale. Moreover, metallic ultrafine particles having a uniform diameter can be obtained in a nonaqueous system, and thus can be expected to be utilized in various fields.

According to a fifth embodiment of a process for producing composite metallic ultrafine particles of the present invention, there is provided a process for producing composite metallic ultrafine particles, characterized by comprising: dissolving or dispersing a metal source in a hydrophilic nonaqueous solvent to prepare a solution for composite metallic ultrafine particles; adding, to a hydrophobic nonaqueous solvent, an organic compound including a functional group having chemisorption capability onto a surface of a core metal produced from the metal source, and the solution for composite metallic ultrafine particles to prepare a precursor of ultrafine particles; and adding a reducing agent to reduce the precursor of ultrafine particles.

The above composite metallic ultrafine particles can be produced in a chemical process in a liquid phase, and, therefore, can be mass-produced with use of a simple apparatus, without use of a large vacuum apparatus, in a usual atmospheric atmosphere. This contributes to lowered cost. Further, since the raw materials used are harmless to the environment, loads on the environment can be small. Moreover, metallic ultrafine particles having a uniform diameter can be obtained in a nonaqueous system, and thus can be expected to be utilized in various fields.

An antioxidant may be added to the solution for composite metallic ultrafine particles to produce composite metallic ultrafine particles having enhanced stability. Even if a metal susceptible to oxidation is used, the addition of the antioxidant enables the composite metallic ultrafine particles to be synthesized. Further, the stability of the composite metallic ultrafine particles can also be increased, and it is possible to store the composite metallic ultrafine particles for a long period of time. As the antioxidant, ascorbic acid or vitamin E may be used, for example.

The metal source may be at least one member selected from the group consisting of inorganic metallic salts and organometallic compounds (including complexes). It is desirable to use a metal source that is reduced at a temperature which is not more than the boiling point of the hydrophobic nonaqueous solvent in the presence of the reducing agent.

The metal constituting the metallic core may be at least one member selected from the group consisting of Cu, Ag, Au, In, Si, Ti, Ge, Sn, Fe, Co, Ni, Ru, Rh, Pd, Os, Ir, Pt, V, Cr, and Bi.

Hydrophilic nonaqueous solvents may be, for example, alcohols having five or less carbon atoms, such as methanol and ethanol, and ketones such as acetone. Particularly, alcohols having five or less carbon atoms, such as methanol and ethanol are preferable. The amount (weight ratio) of hydrophilic nonaqueous solvent is preferably 1 to 40% with respect to the hydrophobic nonaqueous solvent.

The organic compound including a functional group having chemisorption capability onto a surface of the core metal may be at least one member selected from the group consisting of higher alcohols having six or more carbon atoms and surface-active agents, for example.

Citric acid or ascorbic acid may be used as the reducing agent, and the system may gradually be heated to a temperature at which the reduction action is developed.

The hydrophobic nonaqueous solvent may be at least one member selected from the group consisting of petroleum hydrocarbons, such as toluene and xylene, and terpenes, such as terpineol and turpentine. Particularly, petroleum hydrocarbons, such as toluene and xylene, are preferable.

As described above, composite metallic ultrafine particles according to the five embodiments, the melting point of the composite metallic ultrafine particles is extremely lowered, and a metallic film can be formed by a method similar to a type of baking finish. A novel method for forming an interconnection on a semiconductor substrate with use of this process has advantages with respect to an apparatus, the cost, and loads on the environment, unlike conventional vacuum evaporation, sputtering, and immersion plating.

A process according to the present invention basically comprises coating composite metallic ultrafine particles dispersed in a solvent on a semiconductor substrate on which a fine cavity for an interconnection is formed, drying and baking to form a metallic film, then polishing the surface of the substrate to form the interconnection, and cleaning and drying.

According to an embodiment of an apparatus for forming an interconnection of the present invention, there is provided an apparatus for forming an interconnection, characterized by comprising: a loading/unloading section having an inlet/outlet port; a dispersion liquid supply device for supplying a dispersion liquid of composite metallic ultrafine particles to a surface of a substrate, the dispersion liquid of composite metallic ultrafine particles being prepared by dispersing, in a predetermined solvent, the composite metallic ultrafine particles in which a surface of a core metal is covered with an organic compound including a functional group having chemisorption capability onto the surface of the core metal; a heating device for heating the substrate to melt the metal particles and bond them to each other; a polishing device for polishing the surface of the substrate to remove an excessively deposited metal, and a cleaning/drying device for cleaning and drying the polished substrate.

Preferably, the apparatus further comprises a supplementary drying device for drying a solvent contained in the dispersion liquid of composite metallic ultrafine particles which has been supplied to the surface of the substrate. The supplementary drying device can completely dry the solvent which has not been dried by simply spin-drying (air-drying) conducted in spin-coating, for example, so that formation of voids can be prevented during a heating process.

Preferably, the apparatus further comprises a bevel/backside cleaning device for cleaning a peripheral portion and/or a backside surface of the polished substrate.

Preferably, the apparatus further comprises a sensor for measuring a film thickness in at least one of times after evaporation of a solvent contained in the dispersion liquid of composite metallic ultrafine particles which has been supplied to the surface of the substrate, after a heating process in the heating device, and during or after a polishing process in the polishing device.

The sensor for measuring a film thickness may be provided in a substrate holding portion in a substrate transfer device for transferring a substrate. This can eliminate the needs for stop or interruption of processing the substrates and can increase throughput.

It is desirable that pressures in an indoor facility are respectively controlled in a cleaning division having the loading/unloading section and a cleaning/drying section housing the cleaning/drying device, and a treatment division having a dispersion liquid supply section having the dispersion liquid supply device therein, a heating section housing the heating device, and a polishing section housing the polishing device; and a pressure in the cleaning division is controlled so as to be higher than a pressure in the treatment division.

The treatment division in which chemical mist or gas due to chemicals used for each of the processes is dispersed, and the cleaning division for which a clean atmosphere is required are separated from each other so that the pressure in the cleaning division is controlled to be higher than that in the treatment division for preventing the air from flowing into the cleaning division from the treatment division. Hence, the chemical mist or the gas can be prevented from being attached to the substrate after formation of an interconnection.

According to an embodiment of a method for forming an interconnection of the present invention, there is provided a method for forming an interconnection, characterized by comprising: providing a substrate having a fine cavity formed on a surface of the substrate; supplying a dispersion liquid of composite metallic ultrafine particles to the surface of the substrate, the dispersion liquid of composite metallic ultrafine particles being prepared by dispersing, in a predetermined solvent, the composite metallic ultrafine particles in which a surface of a core metal is covered with an organic compound including a functional group having chemisorption capability onto the surface of the core metal; heating the substrate to melt the metal particles and bond them to each other; polishing the surface of the substrate to remove an excessively deposited metal; and cleaning and drying the polished substrate.

BRIEF DESCRIPTION OF THE DRAWINGS

FIG. 1 is a diagram showing an example of production of composite metallic ultrafine particles according to the present invention;

DETAILED DESCRIPTION OF THE PREFERRED EMBODIMENTS

Figure 2A:
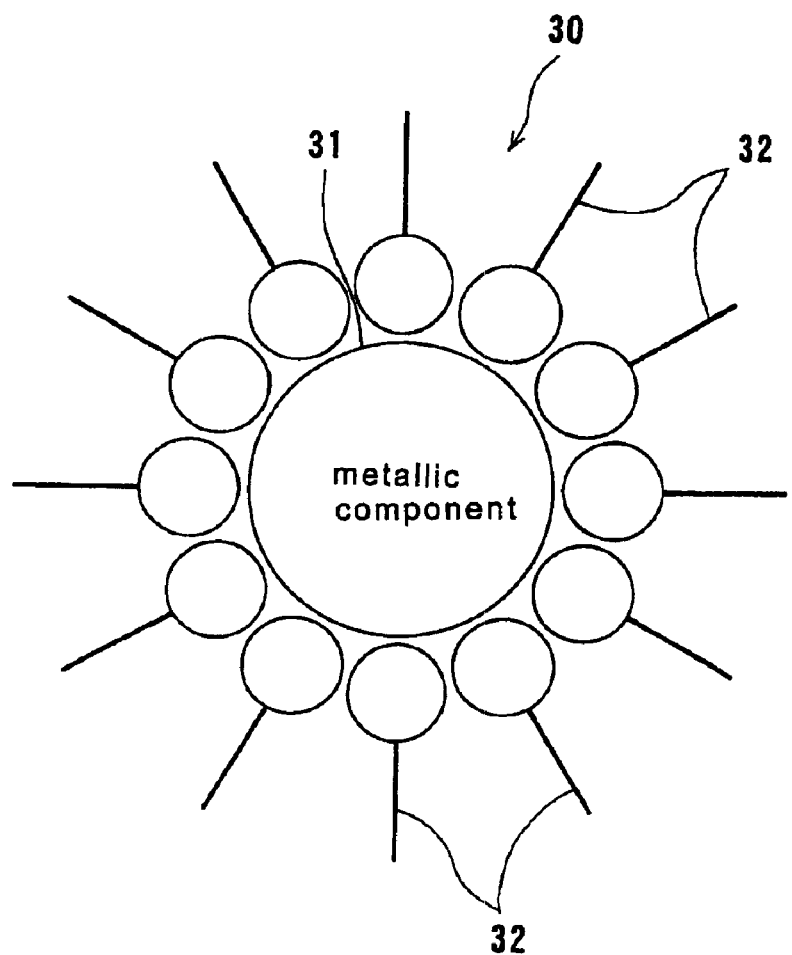
FIGS. 2A and 2B are diagrams schematically showing a composite metallic ultrafine particle according to the present invention.

In a first embodiment of the present invention, composite metallic ultrafine particles are produced as follows: The surface of a core metal produced from a metallic salt, a metallic oxide, or a metallic hydroxide and having a particle diameter of 1 to 100 nm is covered with an organic compound including a functional group having chemisorption capability onto the surface of the core metal.

This organic compound serves as a protective coating for the core metal. Covering the periphery of the core metal with the organic compound (protective coating) can provide composite metallic ultrafine particles which are less likely to agglomerate in a solvent and have excellent dispersion stability. Moreover, the organic compound is strongly chemisorbed onto the surface of the core metal with a chemical bonding strength. Unlike the conventional metallic ultrafine particles, which have been stabilized by coating with use of a surface-active agent, the composite metallic ultrafine particles according to the present invention have enhanced stability in the properties of particles and are stable even with a higher metal content.

The amount of organic compound for covering the core metal in the composite metallic ultrafine particles is preferably 0.01 to 1 molecule, and more preferably 0.05 to 0.5 molecule, per metal atom on the surface of the core metal. For example, in the case where a long-chain alkyl compound is used as the organic compound, when the core metal is silver, the amount of organic compound adsorbed is preferably about 0.25 molecule per metal atom. When the core metal is copper, the amount of organic compound adsorbed is preferably about 0.13 molecule per metal atom. The content of the metal in the ultrafine particles significantly varies depending upon the particle diameter and the molecular weight of the organic compound to be chemisorbed. However, when the practical application of the composite metallic ultrafine particles, for example, to metallic coatings and catalysts is taken into consideration, it is desirable that the composite metallic ultrafine particles have a higher metal content. Thus, the metal content is preferably 70 to 99.5% by weight, and more preferably 90 to 99.5% by weight.

The average particle diameter of the core metal is preferably 1 to 100 nm, and more preferably 1 to 50 nm, and more preferably 1 to 18 nm, and, particularly, more preferably 1 to 10 nm. It has been known that the melting point of metallic particles lowers as the particle diameter decreases. This effect appears when the particle diameter is not more than 100 nm, and becomes significant when the particle diameter is 1 to 18 nm. When the particle diameter is 1 to 10 nm, some metals begin to melt even at around ordinary temperature. However, if the particle diameter of the core metal is excessively small, then the content of the metal in the composite metallic ultrafine particles is lowered, and hence the composite metallic ultrafine particles lose the value as a metal source. The aforementioned particle diameter permits the core metal to melt at not more than a temperature of the melting point inherent in the metal. For example, in the case of silver, its melting point is 1233 K (960° C.), and silver ultrafine particles having a diameter of 30 nm melt at about 150° C.

Therefore, in the case where silver ultrafine particles having a diameter of 30 nm, for example, are used as the core metal, and the periphery of the silver ultrafine particles is covered with the organic compound, a coating consisting solely of melted silver can be formed by heating the particles to not less than the decomposition temperature of the organic compound.

The composite metallic ultrafine particles are produced by mixing a metallic salt, a metallic oxide, or a metallic hydroxide with an organic compound including a functional group having chemisorption capability onto a core metal produced from the metallic salt, the metallic oxide, or the metallic hydroxide, and then heating the mixture under the reflux condition of the organic compound for reaction.

For example, the composite metallic ultrafine particles may be produced as follows: A mixture 10 including a metallic salt, a metallic oxide, or a metallic hydroxide, and an organic compound (reactant) is supplied into a two-neck flask 12, as shown in FIG. 1. An agitation rod 14 is introduced into the flask 12 through one of the necks of the two-neck flask 12. The mixture 10 is agitated through agitation impellers 16 attached to the lower end of the agitation rod 14. A reflux condenser tube 18 is mounted on the other neck, and the flask 12 is heated by a mantle heater 20 to produce composite metallic ultrafine particles. With respect to the heating temperature and the heating time, proper conditions may be selected according to the combination of the metallic salt, the metallic oxide, or the metallic hydroxide with the organic compound. Further, instead of heating with a heater, other means of applying energy, e.g., microwave heating, may be employed.

In this case, the organic compound is evaporated, and the evaporated organic compound is cooled and liquefied through the reflux condenser tube 18 and returned to the inside of the flask 12. In this state, the metallic salt, the metallic oxide, or the metallic hydroxide is decomposed and reduced, so that the color tone of the liquid phase within the flask 12 is changed to indicate the formation of ultrafine particles. In order to promote the decomposition reduction reaction, a chemical reducing agent such as hydrogen or hydrazine may simultaneously be used. If the heating process is performed without the reflux of the organic compound, the metallic salt or the metallic oxide is locally or entirely evaporated to dryness and pyrolyzed to produce bulky metallic particles. Therefore, in order to maintain and promote the reflux state, a solvent having a high boiling point, such as a naphthenic solvent, may simultaneously be used.

Any metallic salt, metallic oxide, or metallic hydroxide may be used as long as it can be pyrolyzed at a relatively low temperature and does not include such a substance that prevents the ultrafine particles from being produced in the reaction by heating. Preferred examples thereof include carbonates, nitrates, chlorides, acetates, formates, citrates, oxalates, urates, phthalates, fatty acid salts having four or less carbon atoms, metallic oxides, and metallic hydroxides, of Ag, Au, Bi, Co, Cu, Cr, Fe, Ge, In, Ir, Ni, Os, Pd, Pt, Rh, Ru, Si, Sn, Ti, and V. More preferred are the carbonate, the formate, the oxalate, the citrate, the oxide, and the hydroxide which produce only metals within the reaction system during pyrolysis.

On the other hand, any organic compound may be used as long as it includes a functional group having chemisorption capability onto the surface of the core metal produced from the metallic salt, the metallic oxide, or the metallic hydroxide, and has a boiling point that is not less than the decomposition temperature of the metallic salt, the metallic oxide, or the metallic hydroxide, and can be maintained in the reflux state under reaction temperature conditions. Preferred examples thereof are organic compounds having a hydroxyl, carboxyl, thiol, amino, or amide group, and having four or more carbon atoms, and more preferably eight or more carbon atoms. However, as the number of included carbon atoms increases, the solubility of the organic compound in a solvent at the time of purification is lowered, so that satisfactory separation and purification cannot be achieved. Therefore, the number of carbon atoms in the organic compound is preferably not more than 22 and, more preferably, not more than 18. It is noted that the decomposition temperature herein does not refer to the decomposition temperature of the metallic salt, the metallic oxide, or the metallic hydroxide per se, but the decomposition temperature thereof in the presence of the organic compound. For example, in the case of silver carbonate, silver carbonate per se is decomposed at around 180° C., and, in the presence of stearyl alcohol, silver carbonate performs reaction even at around 140° C. A mixture of the metallic salt, the metallic oxide, or the metallic hydroxide with the organic compound is heated under the reflux condition of the organic compound for reaction. At this time, the metallic salt, the metallic oxide, or the metallic hydroxide is not necessarily required to be dissolved in the organic compound.

The amount ratio of the metallic salt, the metallic oxide, or the metallic hydroxide to the organic compound is not particularly limited. However, if the amount of organic compound is excessively small, then the reflux state cannot be maintained at the time of heating. In this case, the metallic salt, the metallic oxide, or the metallic hydroxide, or the ultrafine particles are pyrolyzed in a dry state to produce bulky metallic particles. Therefore, the amount ratio should be such that the metallic salt, the metallic oxide, or the metallic hydroxide can be maintained in such a state that it is sufficiently dissolved or dispersed in the organic compound. On the other hand, a portion of the organic compound that is not used for formation of the protective layer is an impurity to be separated and removed in the purification process after the production of the ultrafine particles. Therefore, it is unfavorable that the amount of organic compound used is excessively large. From this point of view, according to the present invention, since the amount ratio of the metallic salt, the metallic oxide, or the metallic hydroxide as the metal source to the organic compound for the protective coating can be manipulated as desired, optimal conditions can be selected throughout the whole processes from synthesis to purification.

After completion of the reaction by heating, the composite metallic ultrafine particles produced are separated from the reaction system to be purified by a conventional method. Commonly used methods, e.g., solvent extraction, agglomeration separation, or centrifugal separation, can be applied to the purification method. Particularly, in the case where the organic coating is nonpolar, when the ultrafine particles are treated with a polar solvent such as ethanol or acetone, the ultrafine particles are agglomerated to grow larger. On the other hand, since impurities such as reaction materials or reaction products are polar, they are dissolved in the solvent. Therefore, only the ultrafine particles covered with the organic compound can be separated by filtration. Further, when the decomposition reaction has excessively proceeded, bulky metallic particles may be formed. Such bulky particles are not dissolved in a polar solvent of the treatment. Therefore, in the case of the separation with a filter paper, for example, the bulky particles are collected on the filter paper, as with the ultrafine particles. However, since the ultrafine particles are easily dispersed in a nonpolar solvent such as toluene or hexane, the particles which have been collected on the filter paper are disperse in such a solvent to separate the bulky metallic particles through precipitation or filtration.

The composite metallic ultrafine particles thus produced are dispersed in a suitable organic solvent, e.g., cyclohexane, to produce a dispersion liquid of composite metallic ultrafine particles. Since the dispersed particles are remarkably fine in such a dispersion liquid of composite metallic ultrafine particles, the dispersion liquid is substantially transparent in such a state that the composite metallic ultrafine particles are mixed with the organic solvent and the organic solvent is agitated. The physical properties of the dispersion liquid, such as surface tension and viscosity, can be adjusted by properly selecting the type of the solvent, the ultrafine particle concentration, the temperature, and the like. The composite metallic ultrafine particles thus produced are so stable as to be stored in air for a long period of time, after drying.

Figure 2B:
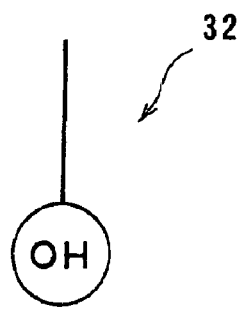

FIGS. 2A and 2B are diagrams schematically showing a structure of a composite metallic ultrafine particle according to a second embodiment of the present invention. This composite metallic ultrafine particle 30 comprises a core metal 31 essentially consisting of a metallic component, and an organic compound 32 including an alcoholic hydroxyl group which surrounds the periphery of the core metal 31. Specifically, the composite metallic ultrafine particle 30 comprises the organic compound 32 including an alcoholic hydroxyl group, and a metallic component derived from the metallic compound as the starting compound. The central portion of the composite metallic ultrafine particle is constituted by the core metal 31, and the periphery thereof is surrounded by the organic compound 32 including an alcoholic hydroxyl group with an alkoxide bond.

The organic compound 32 including an alcoholic hydroxyl group serves as a protective coating for the core metal 31. Thus, covering the periphery of the core metal with the organic compound 32 including an alcoholic hydroxyl group can provide composite metallic ultrafine particles which are less likely to agglomerate in a solvent and have excellent dispersion stability.

Usually, the ratio of the core metal 31 in the composite metallic ultrafine particle 30 may be about 50 to about 95% by weight. For example, when the composite metallic ultrafine particles are used as metallic materials for filling interconnection grooves, the ratio of the core metal 31 is preferably about 60 to about 95% by weight, and, particularly, more preferably 70 to 95% by weight.

The average particle diameter of the core metal 31 in the composite metallic ultrafine particle 30 is usually about 1 to about 100 nm, and preferably about 1 to about 20 nm, and more preferably about 5 to about 15 nm. It has been known that the melting point of metallic particles lowers as the particle diameter decreases. This effect appears when the particle diameter is not more than 100 nm, and becomes significant when the particle diameter is not more than 20 nm. The effect becomes more significant when the particle diameter is not more than 10 nm. Therefore, it is possible to melt the core metal 31 in the composite metallic ultrafine particle 30 at not more than a temperature of the melting point inherent in the metal. For example, in the case of silver, its melting point is 1233 K (960° C.), and silver ultrafine particles having a diameter of 5 nm melt at about 150° C.

Therefore, in the case of a composite metallic ultrafine particle 30 produced by using silver ultrafine particles having a diameter of 5 nm, for example, as the core metal 31, and covering the periphery of the silver ultrafine particle with the organic compound 32 including an alcoholic hydroxyl group, a coating consisting solely of melted silver can be formed by heating the composite metallic ultrafine particle to 150° C. when the decomposition temperature of the organic compound 32 including an alcoholic hydroxyl group is not more than 150° C., or to the decomposition temperature of the organic compound 32 including an alcoholic hydroxyl group when the decomposition temperature of the organic compound is more than 150° C.

However, as the particle diameter decreases, the amount of organic compound covering the core metal relatively increases to lower the core metal ratio. Thus, it is desirable that the particle diameter is large to some extent, and hence the particle diameter is preferably 5 to 15 nm.

The composite metallic ultrafine particles 30 can be produced by heating a metallic compound, e.g., silver carbonate, in the presence of an organic compound including an alcoholic hydroxyl group, e.g., stearyl alcohol, to a temperature which is equal to or higher than the decomposition reduction temperature of the metallic compound and is approximately equal to the decomposition initiation temperature of the organic compound including an alcoholic hydroxyl group. In this case, a reducing agent such as acetaldehyde may be added, and then a heating process may be performed to produce the composite metallic ultrafine particles.

The metal constituting the core metal 31 may be at least one member selected from the group consisting of Cu, Ag, Au, In, Si, Ti, Ge, Sn, Fe, Co, Ni, Ru, Rh, Pd, Os, Ir, Pt, V, Cr, and Bi. The organic compound 32 including an alcoholic hydroxyl group may be a straight-chain or branched-chain alcohol having four or more carbon atoms, or an aromatic compound including a hydroxyl group.

The heating temperature is approximately the decomposition initiation temperature of the organic compound including an alcoholic hydroxyl group and is not less than the decomposition temperature of the metallic compound (metallic salt). For example, in the case of stearyl alcohol, its decomposition initiation temperature is 150° C. Therefore, in this case, the system may be held at a temperature of about 150° C. at which the metallic compound is decomposed. At that time, the heating atmosphere is preferably an inert gas atmosphere. However, a heating process may be performed in air for some selected combination of the organic compound 32 including an alcoholic hydroxyl group and the metallic compound.

After completion of the heating, a purification process is performed by a conventional method. For example, the purification process may be performed by centrifugal separation, membrane purification, or solvent extraction.

The composite metallic ultrafine particles 30 thus produced are dispersed in a suitable organic solvent, e.g., cyclohexane, to prepare a dispersion liquid of composite metallic ultrafine particles. Since the dispersed particles are remarkably fine in such a dispersion liquid of composite metallic ultrafine particles, the dispersion liquid is substantially transparent in such a state that the composite metallic ultrafine particles are mixed with the organic solvent and the organic solvent is agitated. The physical properties of the dispersion liquid, such as surface tension and viscosity, can be adjusted by properly selecting the type of the solvent, the ultrafine particle concentration, the temperature, and the like.

Next, another production process of composite metallic ultrafine particles according to the present invention will be described below.

According to this production process, a metal source is firstly dissolved or dispersed in a hydrophilic nonaqueous solvent to form a solution for composite metallic ultrafine particles. Subsequently, an organic compound including a functional group having chemisorption capability onto the surface of the core metal produced from the metal source, and the solution for composite metallic ultrafine particles is added to a hydrophobic nonaqueous solvent to form an inverted micelle, i.e., a precursor of ultrafine particles. A reducing agent is then added to reduce the precursor of ultrafine particles, for thereby producing composite metallic ultrafine particles comprising a metallic core having a particle diameter of 1 to 100 nm and the organic compound. In this case, preferably, the heating atmosphere is an inert gas atmosphere in order that the organic compound is difficult to be decomposed. However, a heating process may be performed in air for some nonaqueous solvents selected.

Thus, the organic compound including a functional group having chemisorption capability onto the surface of the core metal produced from the metal source, and the solution for composite metallic ultrafine particles is added to the hydrophobic nonaqueous solvent. The periphery of the hydrophilic nonaqueous solvent including a metallic salt is surrounded by the organic compound including a functional group having chemisorption capability onto the surface of the metallic particles, for thereby forming a colloid (inverted micelle) having a uniform size, i.e., a precursor of ultrafine particles.

The organic compound serves to control the particle diameter of composite metallic ultrafine particles. For example, a higher alcohol having six or more carbon atoms, a surface-active agent, or the like serves as a wall of the hydrophilic nonaqueous solvent including the metallic salt. Therefore, both of the two solvents provide a field for the reduction reaction of the metallic salt without being dissolved in each other. The reducing agent is added to reduce the metallic salt within the inverted micelle. Thus, composite metallic ultrafine particles having a diameter of 1 to 100 nm can be synthesized. The size of the final composite metallic ultrafine particles is determined by the concentration of the metallic salt in the field for the reduction reaction. The size of the synthesized composite metallic ultrafine particles increases as the concentration of the metallic salt in the field for the reduction reaction increases, and decreases as the concentration of the metallic salt in the field for the reduction reaction decreases. The amount (weight ratio) of organic compound used is preferably about 1 to about 50% with respect to the hydrophobic nonaqueous solvent.

The higher alcohols include lauryl alcohol and stearyl alcohol, for example. The surface-active agents include sorbitan tristearate, for example.

Further, the periphery of the metallic ultrafine particles is surrounded by the organic compound to form composite metallic ultrafine particles which are less likely to agglomerate and have excellent dispersion stability.

The ratio of the metal in the composite metallic ultrafine particle is not particularly limited. However, the ratio of the metal may usually be about 50 to about 95% by weight. For example, when the composite metallic ultrafine particle is used as a metallic material for filling interconnection grooves, the ratio of the metal is preferably about 60 to about 95% by weight, and, particularly, more preferably 70 to 95% by weight.

The average particle diameter of the metal in the composite metallic ultrafine particles is usually about 1 to 20 nm, and preferably about 1 to 10 nm. It has been known that the melting point of metallic particles lowers as the particle diameter decreases. This effect appears when the particle diameter is not more than 20 nm, and becomes significant when the particle diameter is not more than 10 nm. Therefore, it is possible to melt the metal in the composite metallic ultrafine particle at not more than a temperature of the melting point inherent in the metal. For example, in the case of silver, its melting point is 1233 K (960° C.), and silver ultrafine particles having a diameter of 5 to 10 nm melt at about 80° C.

Therefore, in the case of composite metallic ultrafine particles produced by synthesizing silver ultrafine particles having a diameter of 5 to 10 nm, and covering the periphery of the silver ultrafine particle with the organic compound, a coating consisting solely of melted silver can be formed by heating the composite metallic ultrafine particle to 80° C. when the decomposition temperature of the organic compound is not more than 80° C., or to the decomposition temperature of the organic compound when the decomposition temperature of the organic compound is more than 80° C.

The metallic component in the metal source may be at least one member selected from the group consisting of Cu, Ag, Au, In, Si, Ti, Ge, Sn, Fe, Co, Ni, Ru, Rh, Pd, Os, Ir, Pt, V, Cr, and Bi. The organic compound may be an alcohol having four or less carbon atoms or a surface-active agent.

Any inorganic salt or organometallic compound as the metal source may be used as long as it can be pyrolyzed at a relatively low temperature and does not include such a substance that prevents the ultrafine particles from being produced in the reaction by heating. Preferred examples of the inorganic salt include carbonates, nitrates, and chlorides. Preferred examples of the organometallic compound include metals to which an alkyl or allyl group, preferably an ethyl or methyl group, has been bonded.

Citric acid or ascorbic acid may be used as the reducing agent, and, preferably, the system is gradually heated to a temperature at which the reduction action is developed. Although a highly hazardous or toxic inorganic reducing agent (e.g., $NaBH_4$ or $N_2H_2$) may be used as the reducing agent in some cases, the reduction can also be achieved with use of an organic compound such as formaldehyde or acetaldehyde. When the metal source is an inorganic salt, the amount (mole ratio) of reducing agent added is preferably about 1 to 5 times as much as that of the inorganic salt.

More preferred reducing agents are organic acid compounds such as ascorbic acid and citric acid, which are harmless natural materials.

The addition of an antioxidant enables composite metallic ultrafine particles to be synthesized from a metal liable to be oxidized. Further, the stability of the composite metallic ultrafine particles can also be increased to store the composite metallic ultrafine particles for a long period of time. For example, ascorbic acid has functions of a reducing agent and an antioxidant.

The solution obtained after reduction by heating is stable. A purification process may be performed by a conventional method. For example, the purification process may be performed by precipitation separation, column separation, centrifugal separation, membrane purification, or solvent extraction.

The dispersion liquid obtained after reduction by heating or the composite metallic ultrafine particles purified by the above method are dispersed in a suitable organic solvent, e.g., cyclohexane, to prepare a dispersion liquid of composite metallic ultrafine particles. Since the dispersed particles are remarkably fine in such a dispersion liquid of composite metallic ultrafine particles, the dispersion liquid is substantially transparent in such a state that the composite metallic ultrafine particles are mixed with the organic solvent and the organic solvent is agitated. The physical properties of the dispersion liquid, such as surface tension and viscosity, can be adjusted by properly selecting the type of the solvent, the ultrafine particle concentration, the temperature, and the like.

The composite metallic ultrafine particles may be used, for example, in the so-called dual damascene process in which an interconnection of a copper or silver layer is formed in fine cavities, such as interconnection grooves formed on the surface of a semiconductor substrate or vertically extended holes for communicating between layers, which are called contact holes.

Figure 3A:
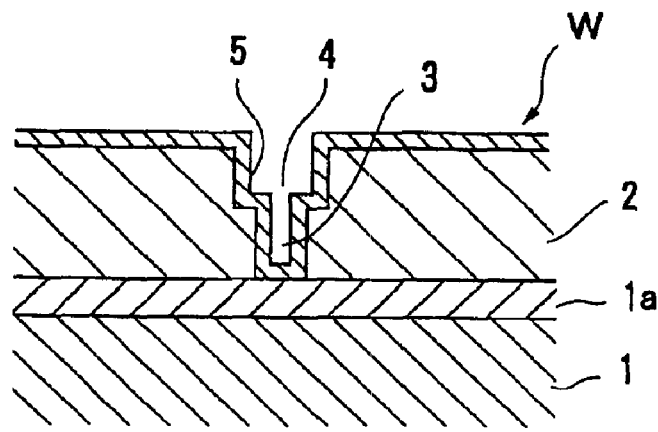
FIGS. 3A through 3F are diagrams showing, in order of processes, a method of forming an interconnection with use of composite metallic ultrafine particles.

FIGS. 3A through 3F show this method of forming an interconnection in order of processes. In a semiconductor substrate W, as shown in FIG. 3A, an insulating film 2 of $SiO_2$ is deposited on a conductive layer 1a on a semiconductor base 1 on which a semiconductor device is formed. A contact hole 3 and an interconnection groove 4 are formed by lithography etching, and a barrier layer 5 of TaN or the like is formed on the insulating layer 2.

On the other hand, an ultrafine particle dispersion liquid L (see FIG. 3B) is prepared by dispersing composite metallic ultrafine particles 30 as shown in FIG. 2A in a predetermined solvent. Since the composite metallic ultrafine particles 30 are covered with the organic compound 32, the composite metallic ultrafine particles 30 are stable and less likely to agglomerate in the solvent.

Figure 3B:
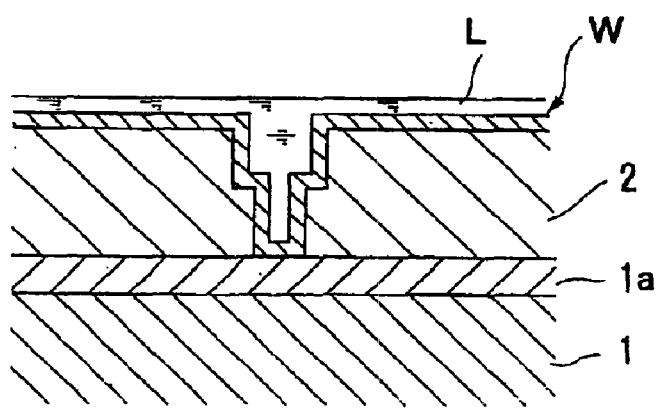

The ultrafine particle dispersion liquid L is uniformly coated so as to cover the whole area of the surface of the substrate W on which an interconnection is formed, as shown in FIG. 3B, for example, by a spin coating process which comprises dropping the ultrafine particle dispersion liquid L at the center of the substrate W or a point somewhat deviated from the center of the substrate W while rotating the substrate W, and stopping the dropping of the ultrafine particle dispersion liquid L at the time when the dispersion liquid L has covered the surface of the substrate W. A liquid film having a predetermined thickness which is determined by the viscosity of the ultrafine particle dispersion liquid L and by the surface tension acted between the surface of the substrate and the ultrafine particle dispersion liquid L, is thus formed on the surface of the substrate.

Figure 3C:
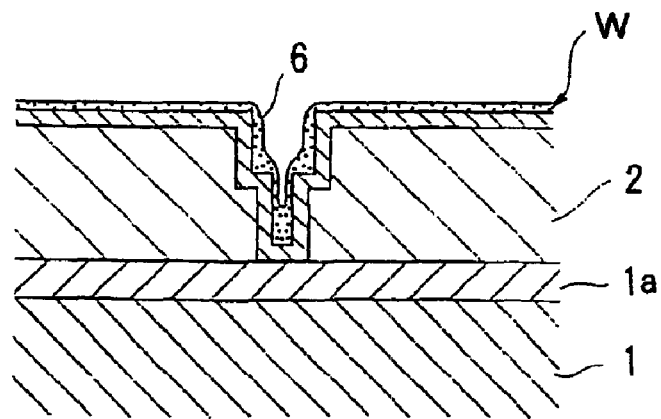

Then, for example, a spin-drying (air-drying) process, in which the substrate W is rotated in such a state that the dropping of the ultrafine particle dispersion liquid L is stopped, is performed to evaporate the solvent contained in the ultrafine particle dispersion liquid L. Thus, as shown in FIG. 3C, a composite metallic ultrafine particle layer 6 formed by agglomeration of the composite metallic ultrafine particles as the solid component is formed within the fine cavity (the contact hole 3 and the interconnection groove 4) and on the surface of the substrate.

Alternatively, a liquid film having a predetermined thickness may be formed on the surface of the substrate W on which an interconnection is formed, by the so-called dipping method in which the substrate W is dipped in the ultrafine particle dispersion liquid L. In this case, a portion of the surface of the substrate which is not required to be coated may be masked, or the ultrafine particle dispersion liquid L may be agitated in order to fill the ultrafine particle dispersion liquid L into the fine cavity (the contact hole 3 and the interconnection groove 4), or the ultrafine particle dispersion liquid L or the substrate W may be vibrated.

Figure 3D:
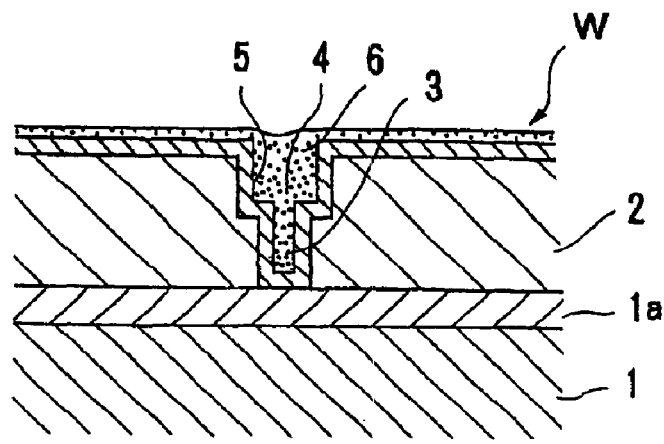
Figure 3E:
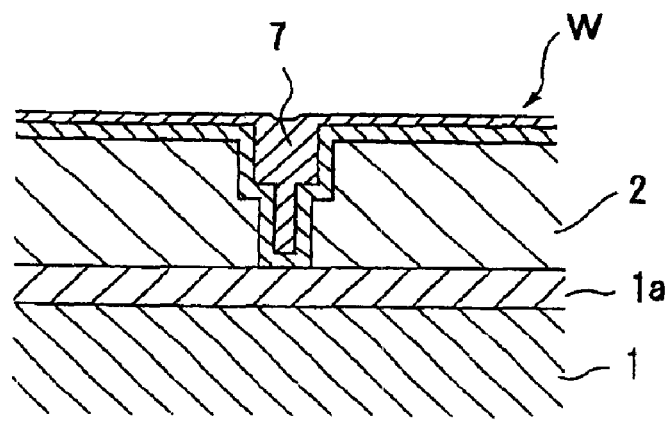

The above process of depositing the ultrafine particle dispersion liquid L onto the surface of the substrate W on which an interconnection is formed and spin-drying is repeated a plurality of times as needed. For example, when the fine cavity (the contact hole 3 and the interconnection groove 4) has been filled with the composite metallic ultrafine particle layer 6 to a predetermined level, as shown in FIG. 3D, the depositing and drying process is stopped. Thereafter, a process of pyrolyzing and decomposing the composite metallic ultrafine particle layer 6 is performed in a heating furnace under controlled atmosphere to melt the metal particles in the composite metallic ultrafine particles and bond them to each other. Thus, a metallic interconnection 7 as shown in FIG. 3E is formed.

Specifically, a heating process of the composite metallic ultrafine particles, which comprises heating the composite metallic ultrafine particles to 300° C. in 5 minutes, holding the temperature of 300° C. for 5 minutes, and cooling the composite metallic ultrafine particles to room temperature in 10 minutes, is performed in an atmosphere of an inert gas, such as $N_2$, containing a small amount of oxygen or ozone. Then, the heating process is performed in an atmosphere of a pure inert gas, e.g., an atmosphere containing only $N_2$. This permits oxygen or ozone to serve as a catalyst for separating the organic compound from the metal and hence can promote decomposition of the ultrafine particles. Further, lampblack generated upon decomposition of the ultrafine particles can be removed from the surface of the substrate by nitrogen, for example, for thereby preventing contamination of the substrate due to fumigation of the lampblack remaining on the surface of the substrate.

When the interconnection is formed with use of composite metallic ultrafine particles having a metallic core of silver, it is desirable that the heating process (baking) is firstly performed in such a state that a nitrogen gas containing a small amount of oxygen or ozone is flowed, and a nitrogen gas containing hydrogen is flowed to form an interconnection of pure silver through a reduction reaction with preventing the oxidation of silver, and then the gas is switched to a nitrogen gas. This can achieve efficient interconnection formation.

Heating decomposition at 450° C. or lower can reduce an adverse effect of heat on the semiconductor substrate or on a circuit formed on the surface of the substrate.

Figure 3F:
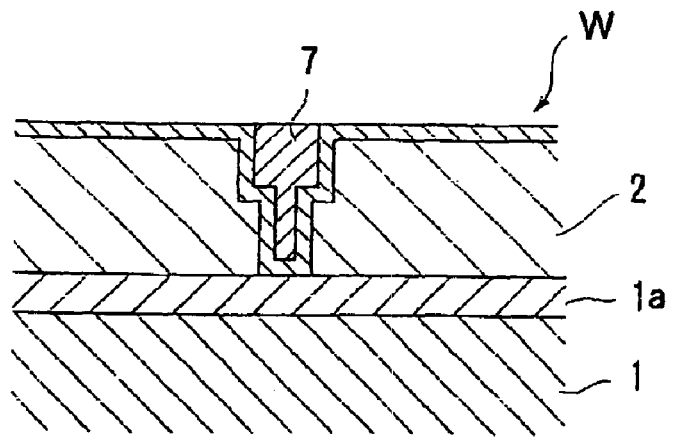

Next, as shown in FIG. 3F, a CMP (chemical mechanical polishing) process is performed for the substrate to remove the metal and the barrier layer deposited on the surface of the substrate. This can also remove excessive portions of the interconnections. A multilayer interconnection structure may be formed by forming an insulating layer on the top of the metallic interconnection 7, providing again the structure as shown in FIG. 3A, on the insulating layer, and repeating the above processes.

An apparatus for performing the aforementioned method of forming an interconnection will be described below with reference to FIGS. 4 through 15.

Figure 4:
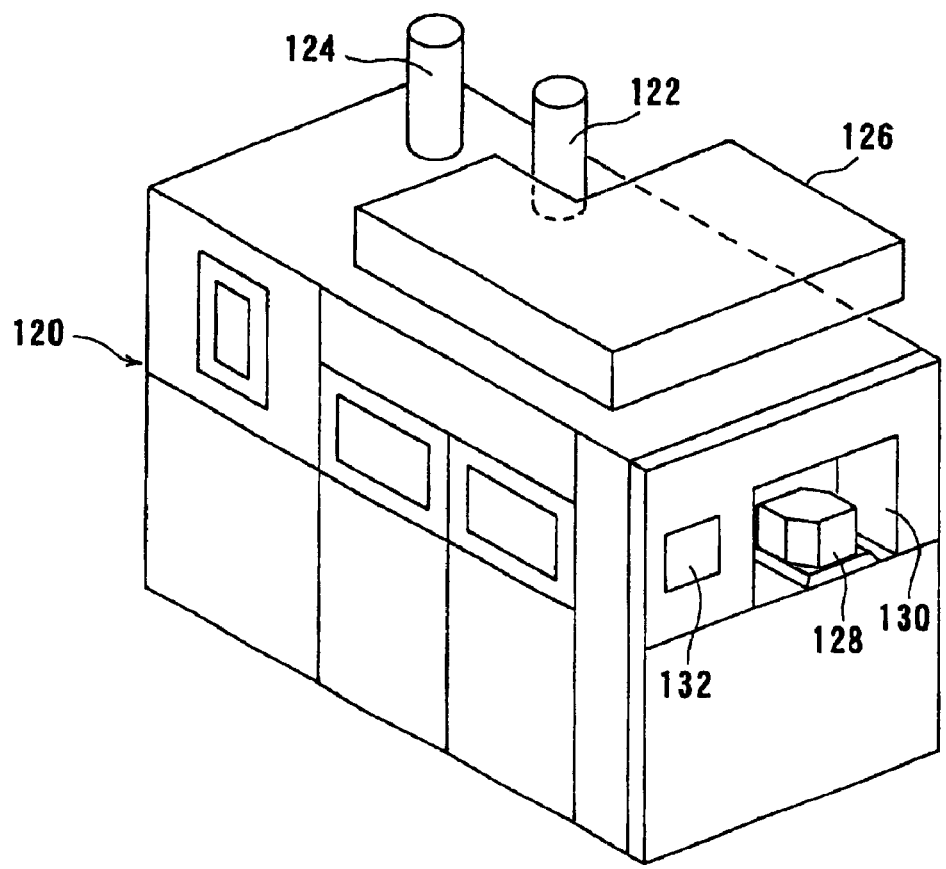
FIG. 4 is a perspective view of an apparatus for forming an interconnection.

FIG. 4 shows a rectangular indoor facility 120 in which an apparatus for forming an interconnection is disposed. On the ceiling of the rectangular indoor facility 120, there are provided an exhaust duct 122 for discharging an exhaust gas from a dispersion liquid supply section 144 and a supplementary drying section 148 described later, an exhaust duct 124 for discharging an exhaust gas from a heating section 152, and an air-conditioning equipment 126 for air-conditioning a polishing section 156 and the like. Further, an inlet/outlet port 130 for taking in and out a cassette 128 accommodating substrates W, and a control panel 132 are provided on a side wall of the rectangular indoor facility 120.

Figure 5:
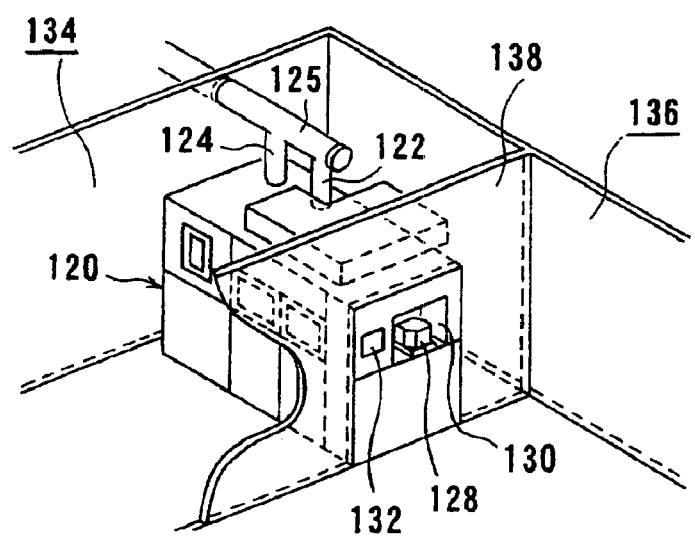
FIG. 5 is a diagram showing an example in which the apparatus for forming an interconnection is disposed in a clean room.

As shown in FIG. 5, the rectangular indoor facility 120 is disposed in a utility zone 134 in a clean room so that an end portion thereof is positioned at an opening provided in a partition wall 138 for separating the utility zone 134 from a clean zone 136, and the inlet/outlet port 130 and the control panel 132 are exposed to the clean zone 136. Both of the exhaust ducts 122 and 124 are connected to a single common exhaust duct 125, which is extended to the exterior of the utility zone 134.

Figure 6:
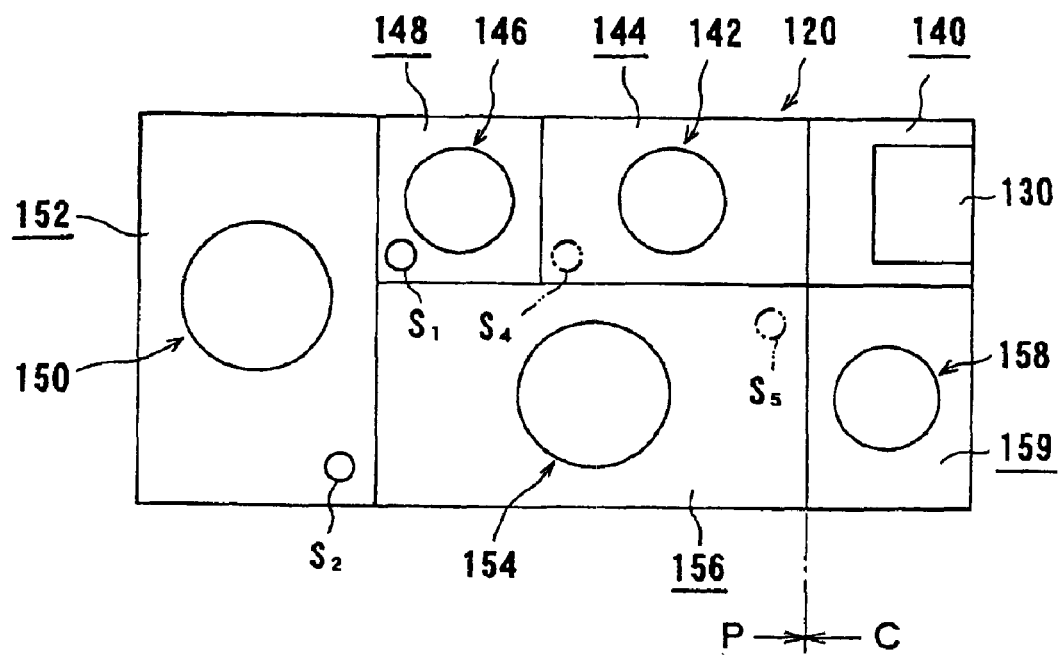
FIG. 6 is a plan arrangement view of the apparatus for forming an interconnection.

As shown in FIG. 6, the interior of the rectangular indoor facility 120 is divided into a loading/unloading section 140 having the inlet/outlet port 130, a dispersion liquid supply section 144 having a dispersion liquid supply device 142 therein, a supplementary drying section 148 having a supplementary drying device 146 therein, a heating section 152 having a heating device 150, a polishing section 156 having a polishing device 154 therein, and a cleaning/drying section 159 having a cleaning/drying device 158 therein. Each of the devices 142, 146, 150, 154, and 158 are disposed in sequence along a direction of a flow of the substrates, so that the processes of forming an interconnection can continuously be performed. The dispersion liquid supply section 144 and the supplementary drying device 146 have an explosion-proof construction from the viewpoint of an organic solvent having explosiveness.

In this embodiment, the indoor facility 120 has one inlet/outlet port, and one cassette is accommodated in the inlet/outlet port. However, the indoor facility 120 may have two inlet/outlet ports, and cassettes may be accommodated in each of the respective inlet/outlet port.

The pressures in the indoor facility 120 are respectively controlled in two divisions, i.e., a cleaning division C having the loading/unloading section 140 and the cleaning/drying section 159, and a treatment division P having the dispersion liquid supply section 144, the supplementary drying section 148, the heating section 152, and the polishing section 156. The pressure in the cleaning division C is controlled so as to be higher than the pressure in the treatment division P and to be lower than atmospheric pressure. This can prevent the air in the cleaning division C from flowing out to the exterior of the indoor facility 120 and can prevent the air in the treatment division P from flowing into the cleaning division C.

Thus, the treatment division P in which chemical mist or gas due to chemicals used for each of the processes is dispersed, and the cleaning division C for which a clean atmosphere is required are separated from each other so that the pressure in the cleaning division C is controlled to be higher than that in the treatment division P for preventing the air from flowing into the cleaning division C from the treatment division P. Hence, the chemical mist or the gas can be prevented from being attached to the substrate after formation of an interconnection.

Preferably, measures against particles should be taken independently for the treatment division P and for the cleaning division C.

Figure 7:
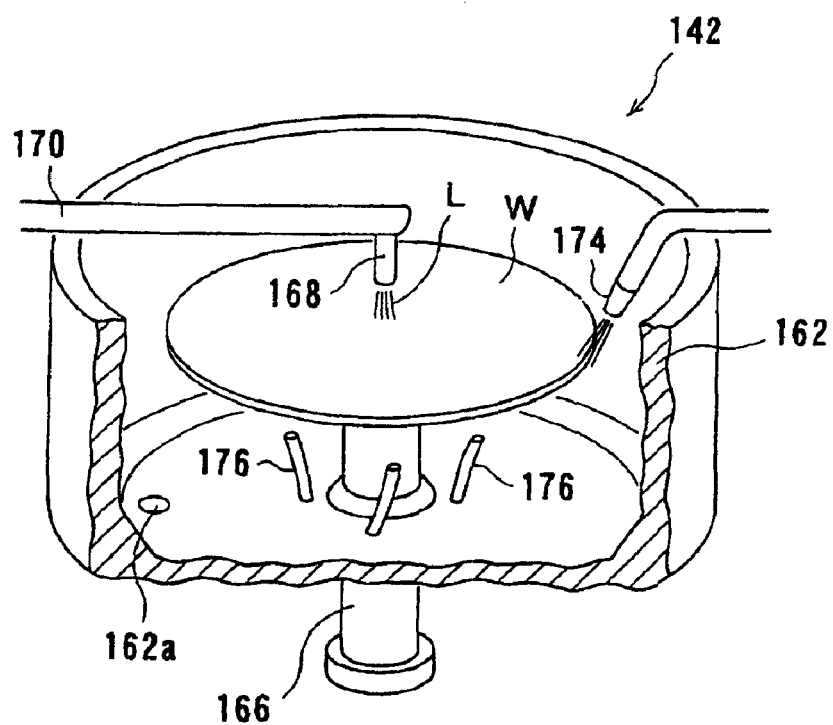
FIG. 7 is a perspective view showing a dispersion liquid supply device in the apparatus for forming an interconnection, which is partly cut away.
Figure 8:
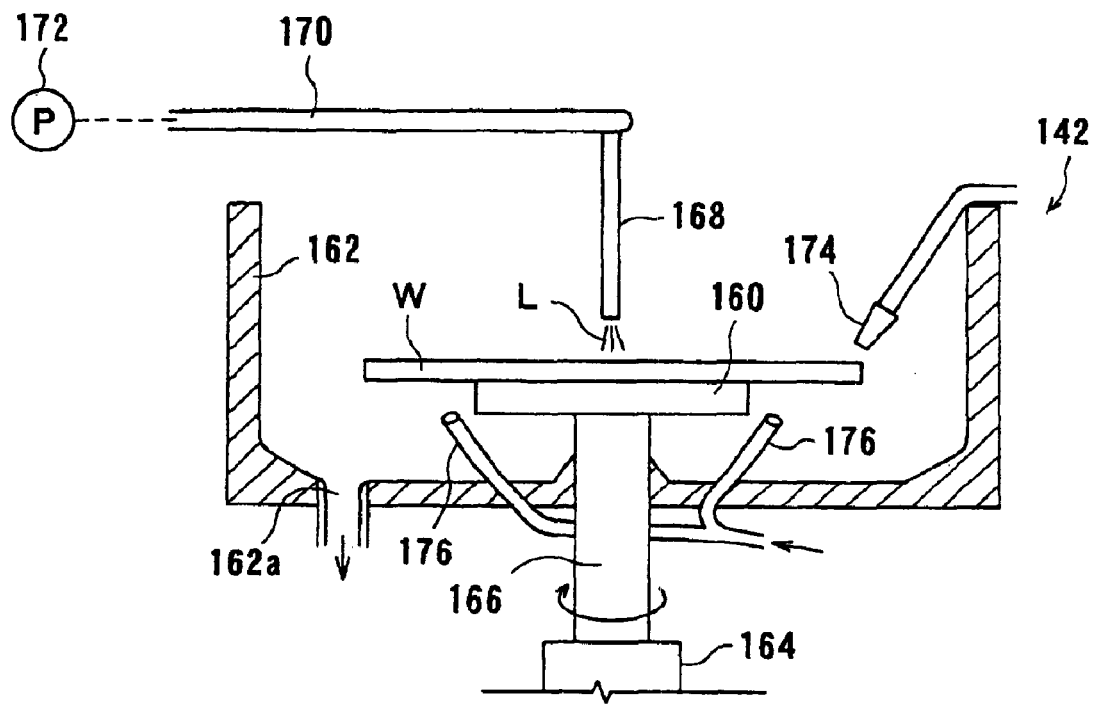
FIG. 8 is a vertical cross-sectional view of the dispersion liquid supply device in the apparatus for forming an interconnection.

FIGS. 7 and 8 show the dispersion liquid supply device 142 for supplying the ultrafine particle dispersion liquid L (see FIG. 3B) onto the surface of the substrate W. The dispersion liquid supply device 142 comprises a substrate holding portion 160 for holding and rotating the substrate W in such a state that the surface (front surface) of substrate on which an interconnection is formed faces upwardly, and a bottomed cup-shaped scattering preventive plate 162 surrounding the substrate W held on the substrate holding portion 160. The substrate holding portion 160 has a vacuum chuck for attracting and holding the substrate W on its upper surface, and is connected to the upper end of a rotatable shaft 166 extending from a servomotor 164. When the servomotor 164 is actuated, the substrate holding portion 160 is rotated. The cup-shaped scattering preventive plate 162 is made of a material resistant to an organic solvent, e.g., stainless steel.

A dispersion liquid supply nozzle 168 facing downwardly for dropping the ultrafine particle dispersion liquid L is disposed above the center or an eccentric position of the surface of the substrate W held on the substrate holding portion 160. The dispersion liquid supply nozzle 168 is connected to a free end of an arm 170. The arm 170 has a pipe therein for supplying a certain amount of ultrafine particle dispersion liquid L, for example, a pipe extended from a constant supply device 172 such as a syringe pump. The pipe communicates with the dispersion liquid supply nozzle 168.

Further, a bevel cleaning nozzle 174 inclined radially inwardly and downwardly for supplying a cleaning liquid to a bevel portion of the substrate W is disposed above the peripheral portion of the substrate W held on the substrate holding portion 160. A plurality of backside surface cleaning nozzles 176 inclined radially outwardly and upwardly for supplying a gas or a cleaning liquid to the backside surface of the substrate W are disposed below the substrate W held on the substrate holding portion 160. A drain hole 162a is provided in the bottom of the scattering preventive plate 162.

The substrate W held on the substrate holding portion 160 is rotated at a rotational speed of 300 to 500 rpm, preferably 400 to 500 rpm by actuating the servomotor 164. A certain amount of ultrafine particle dispersion liquid L is dropped to a central portion of the surface of the substrate W from the dispersion liquid supply nozzle 168. When the surface of the substrate W is covered with the ultrafine particle dispersion liquid L, the dropping of the ultrafine particle dispersion liquid L is stopped, and hence the surface of the substrate W is uniformly coated with the ultrafine particle dispersion liquid L. In this case, a hydrophilic organic solvent such as methanol or acetone, or a cleaning liquid such as ethanol or isopropyl alcohol is simultaneously supplied to the bevel portion of the substrate W from the bevel cleaning nozzle 174, for thereby preventing the ultrafine particle dispersion liquid L from coating the outer circumferential surface and the backside surface of the substrate W. Further, a gas such as $N_2$ gas or air, or a cleaning liquid similar to that supplied to the bevel cleaning nozzle 174 is supplied to the backside surface of the substrate W from the backside surface cleaning nozzles 176, so that the air flow or the cleaning liquid can prevent the backside surface of the substrate W from being contaminated.

A spin-drying (air-drying) process in which the substrate W is rotated via the servomotor 64 in such a state that the dropping of the ultrafine particle dispersion liquid L is stopped is performed to evaporate the solvent contained in the ultrafine particle dispersion liquid L coating the substrate W.

The above process of depositing the ultrafine particle dispersion liquid L onto the surface of the substrate W on which an interconnection is formed and spin-drying is repeated a plurality of times as needed. For example, when the fine cavity (the contact hole 3 and the interconnection groove 4) has been filled with the composite metallic ultrafine particle layer 6 to a predetermined level, as shown in FIG. 3D, i.e., when the thickness of the composite metallic ultrafine particle layer 6 reaches a predetermined value, the depositing and drying process is stopped.

At the end of this process, the substrate W may be rotated at a higher rotational speed to promote the drying process of the solvent. An extra ultrafine particle dispersion liquid L and the cleaning liquid used for cleaning the bevel portion and the backside surface of the substrate are discharged to the exterior via the drain hole 162a.

Figure 9:
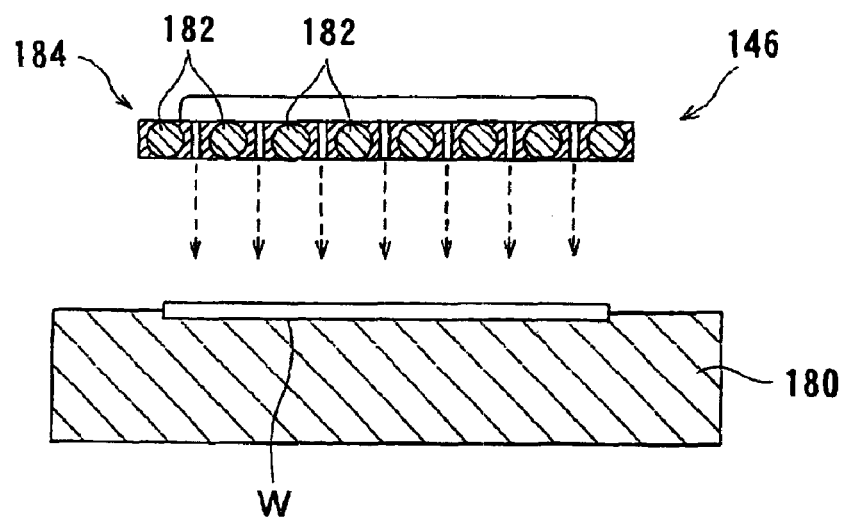
FIG. 9 is a cross-sectional view of a supplementary drying device in the apparatus for forming an interconnection.
Figure 10:
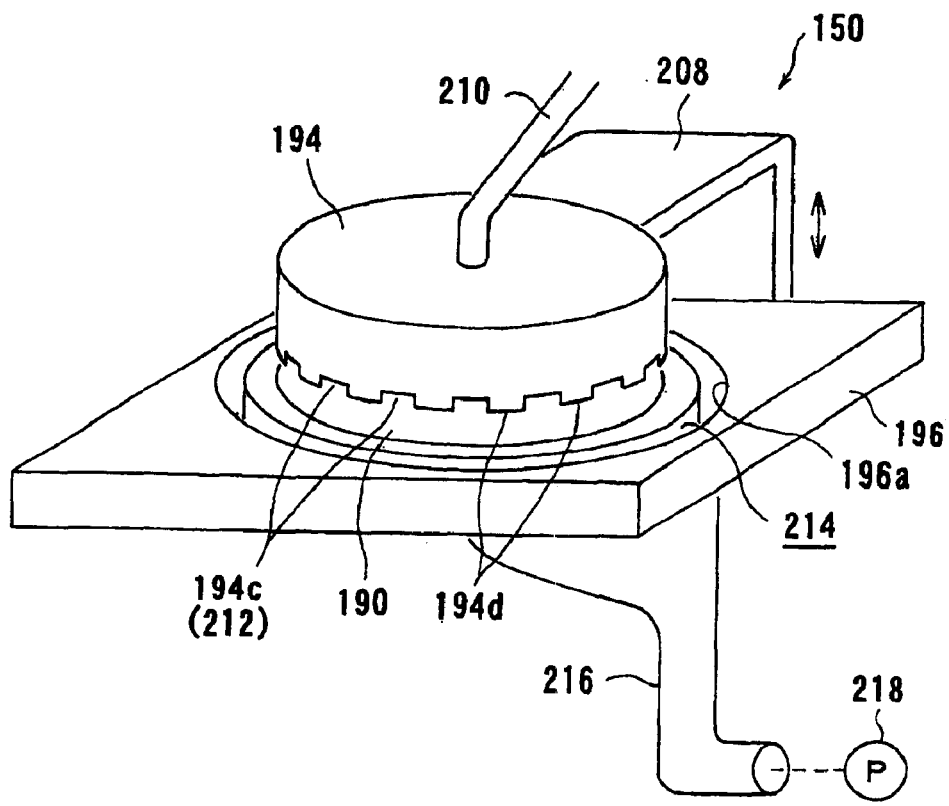
FIG. 10 is a schematic view of a heating device in the apparatus for forming an interconnection.
Figure 11:
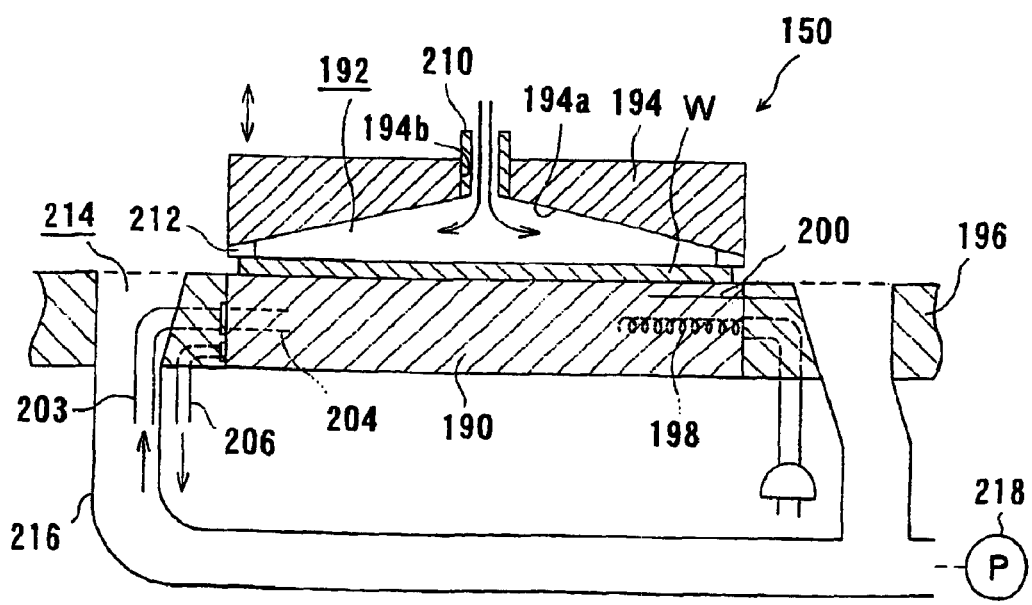
FIG. 11 is a vertical cross-sectional view of the heating device in the apparatus for forming an interconnection.
Figure 12:
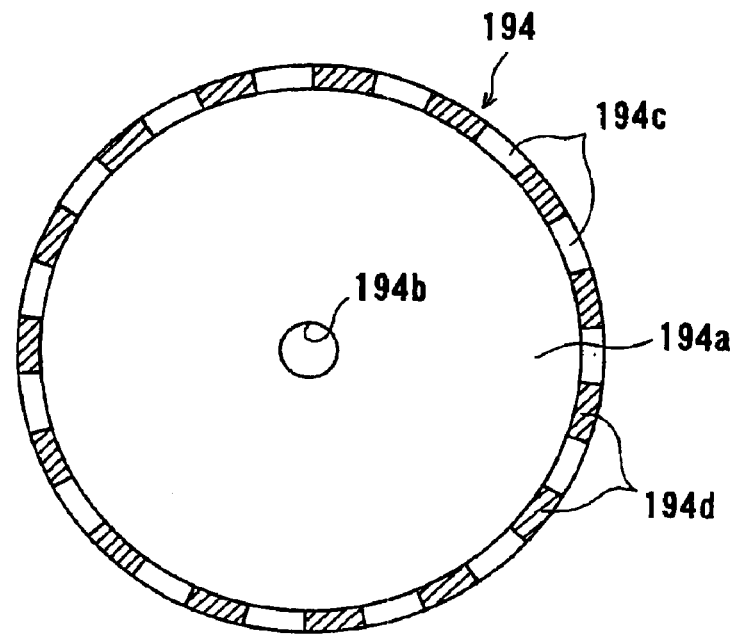
FIG. 12 is a rear view of a housing of the heating device in the apparatus for forming an interconnection.
Figure 13:
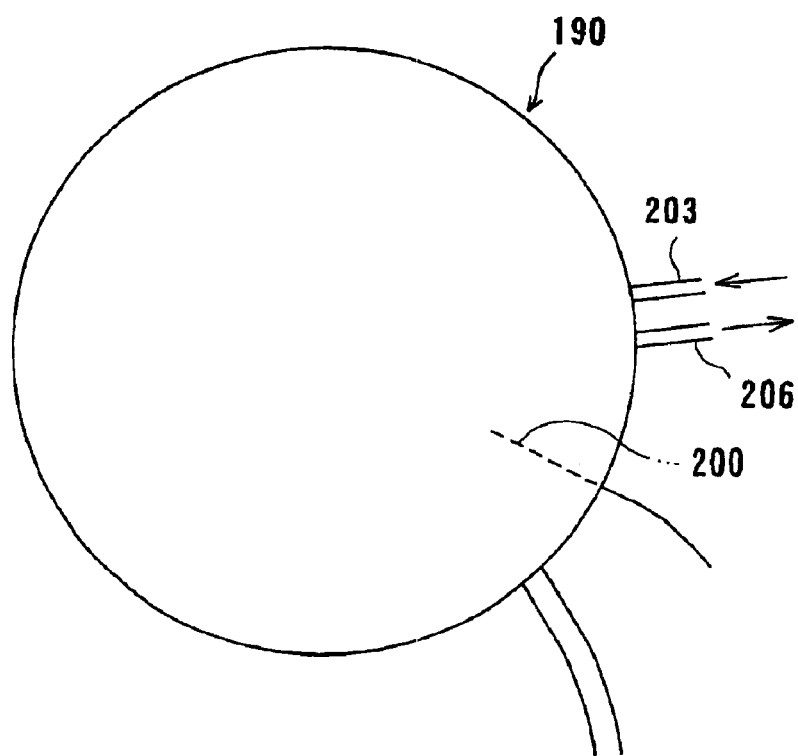
FIG. 13 is a plan view of a heating plate of the heating device in the apparatus for forming an interconnection.

FIG. 9 shows the supplementary drying device 146. The supplementary drying device 146 comprises a substrate holding portion 180 for holding a substrate W in such a state that the surface of the substrate W faces upwardly, and a heating device 184 disposed above the substrate holding portion 180 and having lamp heaters 182, for example.

The supplementary drying device 146 serves to dry a solvent that has not been evaporated by the above spin-drying process in the dispersion liquid supply device 142. When a solvent has sufficiently been dried by the spin-drying process in the dispersion liquid supply device 142, e.g., in the case of considerably thin coating, the supplementary drying device 146 is not required.

If the heating process is performed in such a state that an organic solvent remains in a composite metallic ultrafine particle layer 6 (see FIG. 3D) deposited on the surface of the substrate W, then voids may be formed on the bottom of the groove. Therefore, the solvent is completely dried by the supplementary drying device 146 to prevent formation of voids. The supplementary drying device 146 preferably heats the substrate W at a temperature that is lower than the decomposition temperature of the ultrafine particles, for example, about 100° C., to thus prevent the supplementary drying device 146 from being contaminated by decomposition of the ultrafine particles.

FIGS. 10 through 13 show the heating device 150 for heating the composite metallic ultrafine particle layer 6 (see FIG. 3D) to melt the metal particles and bond them to each other. The heating device 150 comprises a heating plate 190 for holding and heating the substrate W in such a state that the surface of the substrate W faces upwardly, a housing 194 for covering the substrate W held on the heating plate 190 to form a gas chamber 192 between the heating plate 190 and the housing 194, and a frame 196 surrounding the peripheral portion of the heating plate 190.

The heating plate 190 is formed of a material having a high thermal conductivity, such as aluminum or copper, in order to heat the substrate W uniformly and speedily. The heating plate 190 has a disk-like shape and comprises therein a heater 198 and a temperature sensor 200 for detecting a temperature of the heating plate 190. A cooling medium flow passage 204 communicating with an introduction passage 203 for introducing a cooling medium as coolant gas or air is formed and communicates with a discharge passage 206 for discharging a cooling medium.

On the other hand, the housing 194 made of, for example, ceramics is fixed to a free end of a vertically movable arm 208. The housing 194 has a conical recess 194a, at its lower surface, for defining a gas chamber 192 between the conical recess 194a and the substrate W placed on a heating plate 190 when the housing 194 is moved downwardly. Further, a gas supply port 194b is provided at the central portion of the housing 194. The gas supply port 194b is connected to a gas supply pipe 210. Slit portions 194c and pressing portions 194d are alternately formed at a lower peripheral portion of the housing 194. Thus, when the housing 194 is moved downwardly, the pressing portions 194d are brought into contact with the outer peripheral portion of the substrate W placed on the heating plate 190 for thereby holding the substrate W between the heating plate 190 and the pressing portions 194d, and defining gas discharge ports 212 by the slit portions 194c.

Further, a through-hole 196a is formed in a frame 196, and a gas intake port 214 is defined on the inner side of the through-hole 196a. An exhaust duct 216 which communicates with the gas intake port 214 is fixed to the lower surface of the frame 196, and an exhaust blower 218 is connected to the exhaust duct 216.

Thus, a heating process which comprises placing and holding the substrate W on the upper surface of the heating plate 190, heating the substrate W to 300° C. in 5 minutes, holding the temperature of 300° C. for 5 minutes, and cooling the substrate W to room temperature in 10 minutes, is performed to melt the metal particles of the composite metallic ultrafine particles and bond them to each other. At this time, an inert gas, such as $N_2$ containing a small amount of oxygen or ozone is introduced into the gas chamber 192 from the gas supply pipe 210, and then a pure inert gas, such as $N_2$, is introduced into the gas chamber 192 from the gas supply pipe 210. This permits oxygen or ozone to serve as a catalyst for separating the organic compound from the metal and hence can promote decomposition of the ultrafine particles. Further, lampblack generated when ultrafine particles are decomposed can be removed from the surface of the substrate by $N_2$ gas, for example, for thereby preventing contamination of the substrate due to fumigation of the lampblack remaining on the surface of the substrate.

If the amount of oxygen or ozone to be introduced at this time is large, the composite metallic ultrafine particles tend to be adversely oxidized. Therefore, a small amount of oxygen or ozone is sufficient to be introduced.

When the interconnection is formed with use of composite metallic ultrafine particles having a metallic core of silver, it is desirable that the heating process (baking) is firstly performed in such a state that a nitrogen gas containing a small amount of oxygen or ozone is flowed, and a nitrogen gas containing hydrogen is flowed to form an interconnection of pure silver through a reduction reaction with preventing the oxidation of silver, and then the gas is switched to a nitrogen gas. This can achieve efficient interconnection formation.

Figure 14:
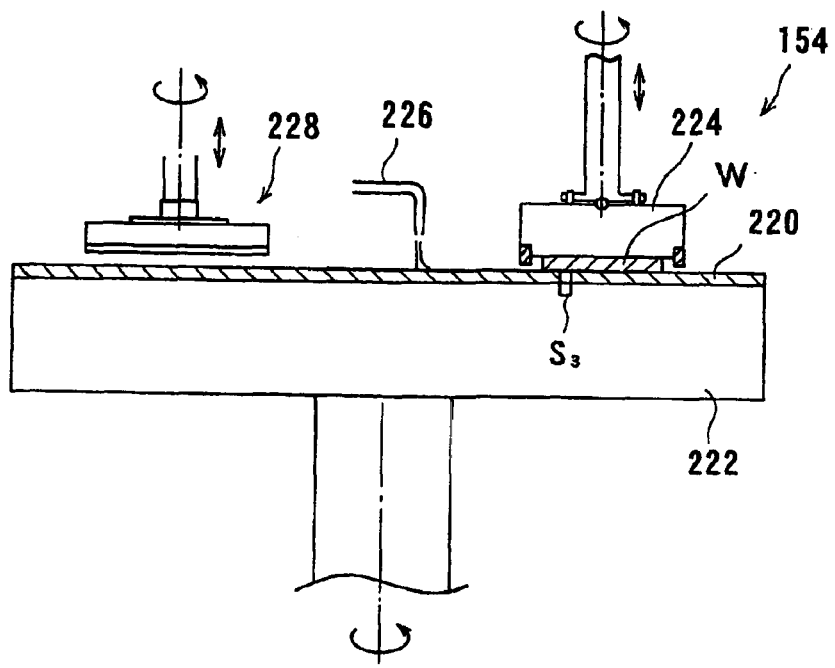
FIG. 14 is a schematic view of a polishing device in the apparatus for forming an interconnection.

FIG. 14 shows the polishing device 154 for removing an excessive metal from the surface of the substrate W with a chemical mechanical polishing process. The polishing device comprises a polishing table 222 having a polishing cloth (polishing pad) 220 constituting a polishing surface, which is attached on the upper surface of the polishing table 222, and a top ring 224 for holding the substrate W in such a manner that the surface, to be polished, of the substrate W faces the polishing table 222. The polishing table 222 and the top ring 224 are rotated independently of each other. While an abrasive liquid is being supplied to the polishing cloth 220 from an abrasive liquid nozzle 226 disposed above the polishing table 222, the substrate W is pressed against the polishing cloth 220 under a constant pressure by the top ring 224 to polish the surface of the substrate W. The abrasive liquid supplied from the abrasive liquid nozzle 226 comprises an alkaline solution containing abrasive particles of fine particles, e.g., silica, suspended therein. The semiconductor wafer W is polished to a flat mirror finish by a chemical mechanical polishing process of a composite effect comprising a chemical polishing effect of the alkaline solution and a mechanical polishing effect of the abrasive particles.

When the polishing process is continuously performed with such a polishing device, the polishing capability of the polishing surface of the polishing cloth 220 is lowered. In order to recover the polishing capability, a dresser 228 is provided, and a dressing process of the polishing cloth 220 is performed at the time of the replacement of the substrate W to be polished, for example. In this dressing process, a dressing surface (dressing member) of the dresser 228 is pressed against the polishing cloth 220 on the polishing table 222, and the dresser 228 and the polishing table 222 are independently rotated to remove the abrasive liquid and polishing wastes attached to the polishing surface and to flatten and dress the polishing surface, whereby the polishing surface is regenerated.

Figure 15A:
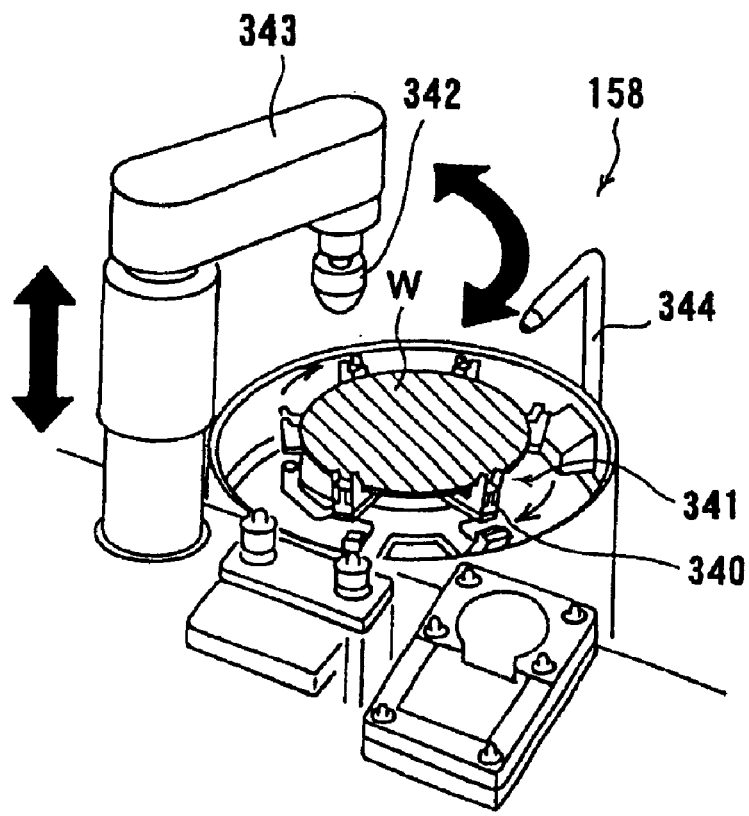
FIG. 15A is a perspective view of a cleaning/drying device in the apparatus for forming an interconnection.
Figure 15B:
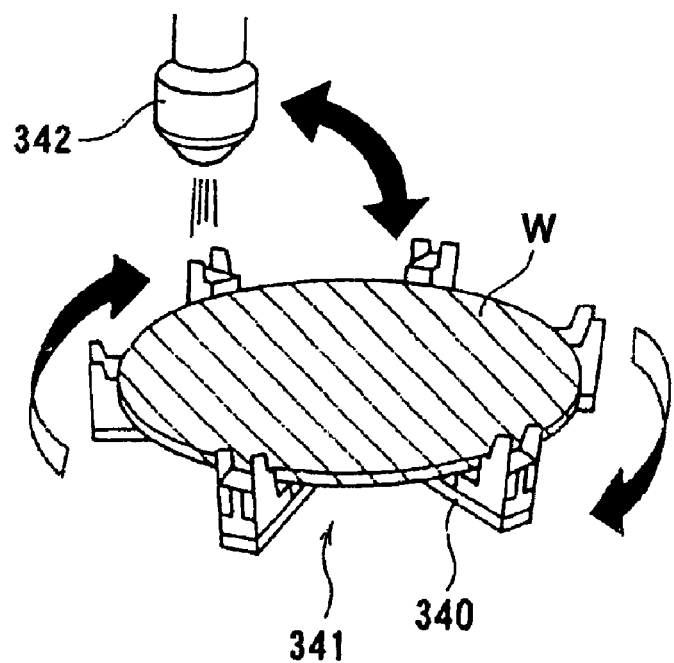
FIG. 15B is an enlarged view of a portion thereof.

FIGS. 15A and 15B show a cleaning/drying device 158 for cleaning and spin-drying the polished substrate W. The cleaning/drying device 158 comprises a rotatable table 341 in which arms 340 for holding the substrate W are radially fixed to upper ends of a rotatable shaft of the rotatable table 341, a swing arm 343 having a cleaning nozzle 342 for supplying a cleaning liquid vibrated by ultrasonic waves, for example, to the surface of the substrate W, and a gas nozzle 344 for supplying an invert gas. A cleaning liquid is ejected from the cleaning nozzle 342 onto the surface of the substrate W in such a state that the substrate W is held horizontally on the rotatable table 341 and rotated, for thereby cleaning the surface of the substrate W. Then, the substrate W is rotated at a high rotational speed of 1500 to 15000 rpm, for example, to be spin-dried. Simultaneously, an inert gas is supplied from the gas nozzle 344, and the substrate W is heated to promote the drying process.

Here, as shown in FIG. 6, a film thickness sensor $S_1$ for measuring the film thickness of the composite metallic ultrafine particle layer 6 (see FIG. 3D) from which the solvent has been evaporated in the supplementary drying device 146 is disposed in the supplementary drying section 148. A film thickness sensor $S_2$ for measuring the film thickness of the heat-treated metallic interconnection 7 (see FIG. 3E) is disposed in the heating section 152. Further, as shown in FIG. 14, a film thickness sensor $S_3$ for measuring the film thickness of the metallic interconnection 7 (see FIG. 3E) during the polishing process is embedded in the polishing table 222 of the polishing device 154.

The film thicknesses in respective processing stages are measured with these film thickness sensors $S_1$ through $S_3$. When the measurement results indicate a shortage of the film thickness, the substrate is returned to the dispersion liquid supply device 142, where the ultrafine particle dispersion liquid L is uniformly coated on the substrate W so as to cover the whole surface of the substrate W on which an interconnection is formed, and the substrate is rotated to be spin-dried (air-dried) for adjusting the film thickness to be a constant value or a desirable value. Simultaneously, on the basis of the measurement results of the film thickness, the total amount of ultrafine particle dispersion liquid L to be supplied onto the substrate, to be processed, by the dispersion liquid supply device 142 is controlled. Specifically, the number of repetition of the process comprising uniformly coating the ultrafine particle dispersion liquid L on the substrate W so as to cover the whole surface of the substrate W on which an interconnection is formed, and spin-drying (air-drying), or the amount of ultrafine particle dispersion liquid L to be coated on the substrate W is increased or decrease for adjustment. Thus, the measurement results of the film thickness are made to reflect later processes.

In the present embodiment, an example in which the three sensors in total are provided in each of the steps is shown. However, only one sensor may be provided. If the supplementary drying device 146 is not provided, then a film thickness sensor $S_4$ for measuring the film thickness of the composite metallic ultrafine particle layer 6 (see FIG. 3D) from which the solvent has been evaporated may be provided in the dispersion liquid supply section 144, as shown by an imaginary line in FIG. 6. Further, a film thickness sensor $S_5$ for measuring the film thickness of the metallic interconnection 7 (see FIG. 3E) after the polishing process may be provided in the polishing section 156, instead of or in addition to the film thickness sensor $S_3$ embedded in the polishing table 222 of the polishing device 154, as shown by a imaginary line in FIG. 6.

According to the apparatus for forming an interconnection thus constructed, the cassette 128 accommodating the substrates W is firstly introduced into the inlet/outlet port 130. One of the substrates W is taken out of the cassette 128 and is transferred to the dispersion liquid supply device 142 in the dispersion liquid supply section 144. In dispersion liquid supply device 142, the ultrafine particle dispersion liquid L is supplied onto the surface of the substrate W and the substrate W is spin-dried. This operation is repeated a plurality of times as needed. When the thickness of the composite metallic ultrafine particle layer 6 (see FIG. 3D) reaches a predetermined level, the substrate W is transferred to the supplementary drying device 146 in the supplementary drying section 148. Next, the substrate from which the solvent in the composite metallic ultrafine particle layer 6 has been evaporated in the supplementary drying device 146 is transferred to the heating device 150 in the heating section 152. In the heating device 150, the composite metallic ultrafine particle layer 6 (see FIG. 3D) is heated to melt the metal particles and bond them to each other, for thereby forming a metallic interconnection 7 (see FIG. 3E).

Next, the substrate on which the metallic interconnection 7 is formed is transferred to the polishing device 154 in the polishing section 156. In the polishing device 154, a chemical mechanical polishing process is performed to remove an excessive metal on the surface of the substrate W. The substrate W is then transferred to the cleaning/drying device 158 to be cleaned and dried. Thereafter, the substrate W is returned to the cassette 128. According to this apparatus for forming an interconnection, a series of processes can continuously be performed.

Further, the film thicknesses are measured with the film thickness sensors. When the sensors indicate a shortage of the film thickness, the substrate is returned to the dispersion liquid supply device 142 to adjust the film thickness to be a constant value or a desired value. Thus, the measurement results of the film thickness are made to reflect later processes.

Figure 16:
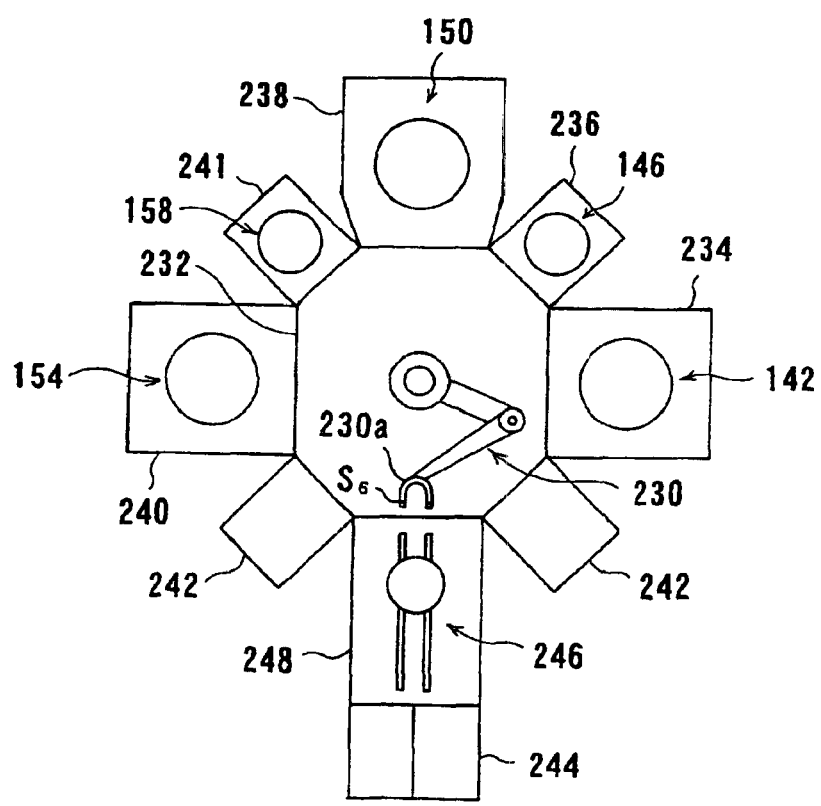
FIG. 16 is a plan arrangement view showing another example of an apparatus for forming an interconnection.

FIG. 16 shows another example of an apparatus for forming an interconnection. In the apparatus, a dispersion liquid supply chamber 234 housing a dispersion liquid supply device 142, a supplementary drying chamber 236 housing a supplementary drying device 146, a heating chamber 238 housing a heating device 150, a polishing chamber 240 housing a polishing device 154, a cleaning/drying chamber 24 housing a cleaning/drying device 158, and a plurality of stock yards (temporary stock chambers) 242 disposed at predetermined positions between these chambers are radially provided with being centered at a central transfer chamber 232 having a transfer robot 230 therein. A second transfer chamber 248 having a movable robot 246 is disposed between a loading/unloading chamber 244 and the transfer chamber 232.

According to this apparatus for forming an interconnection, the dispersion liquid supply chamber 234 housing the dispersion liquid supply device 142, the supplementary drying chamber 236 housing the supplementary drying device 146, and the like can be unitized. Further, operations, such as supply of the dispersion liquid and supplementary drying, can respectively be performed and combined for forming an interconnection.

In this example, the transfer robot 230 is equipped with a plurality of film thickness sensors $S_6$ in the hand portion (substrate holding portion) 230a. Thus, the transfer robot 230 comprises the film thickness sensors $S_6$ for measuring the film thickness of the substrate during the transfer course. This can eliminate the needs for stop or interruption of processing the substrates and can increase throughput.

As the film thickness sensors $S_1$ through $S_6$, any sensor may be used as long as it can measure the film thickness. However, it is desirable to use an eddy current sensor. The eddy current sensor generates an eddy current and detects the frequency and loss of the current that returned after passing through the substrate W for measuring the film thickness. The eddy current sensor is used in a non-contact manner. Further, an optical sensor is also suitable. The optical sensor irradiates a light to a sample and directly measures the film thickness from optical information on the reflected light. The optical sensor can measure not only the film thickness of a metallic film but also the thickness of an insulating film such as an oxide film. The positions at which the film thickness sensors are to be disposed are not limited to those as shown is the drawings. Of course, a desired number of sensors may be disposed at desired positions.

When the transfer robot used has a dry hand for handling a dry substrate and a wet hand for handling a wet substrate, a film thickness sensor may be provided in either one or both of the hands.

Figure 17:
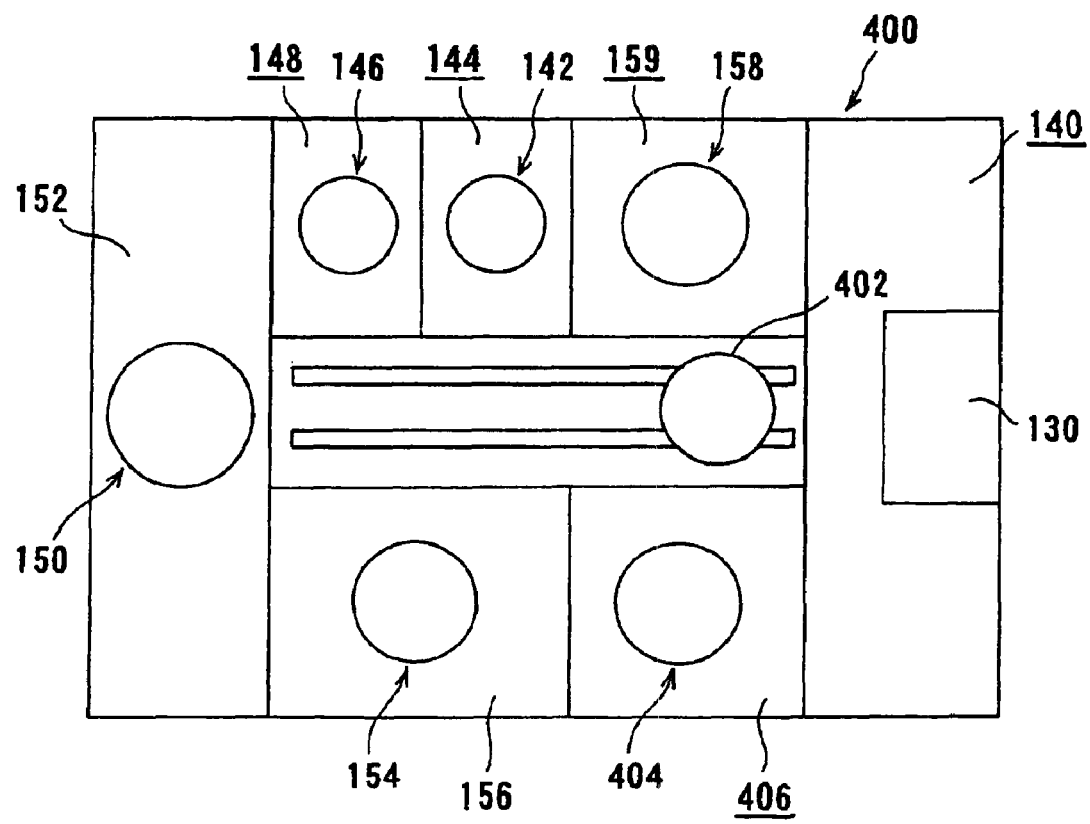
FIG. 17 is a plan arrangement view showing another example of an apparatus for forming an interconnection.

FIG. 17 shows still another example of an apparatus for forming an interconnection. A movable transfer robot 402 optionally equipped with a film thickness sensor is disposed in an indoor facility 400. The interior of the indoor facility 400 is divided into a loading/unloading section 140 having an inlet/outlet port 130, a dispersion liquid supply section 144 housing a dispersion liquid supply device 142, a supplementary drying section 148 housing a supplementary drying device 146, a heating section 152 housing a heating device 150, a polishing section 156 housing a polishing device 154, a bevel/backside cleaning section 406 housing a bevel/backside cleaning device 404, and a cleaning/drying section 159 housing a cleaning/drying device 158. The devices 142, 146, 150, 154, 404 and 158 are disposed in sequence along a direction of a flow of the substrates, so that the processes of forming an interconnection can continuously be performed. These devices, except the bevel/backside cleaning device 404, have the same structures as the corresponding devices described above, and hence a detailed explanation thereof is omitted here.

Figure 18:
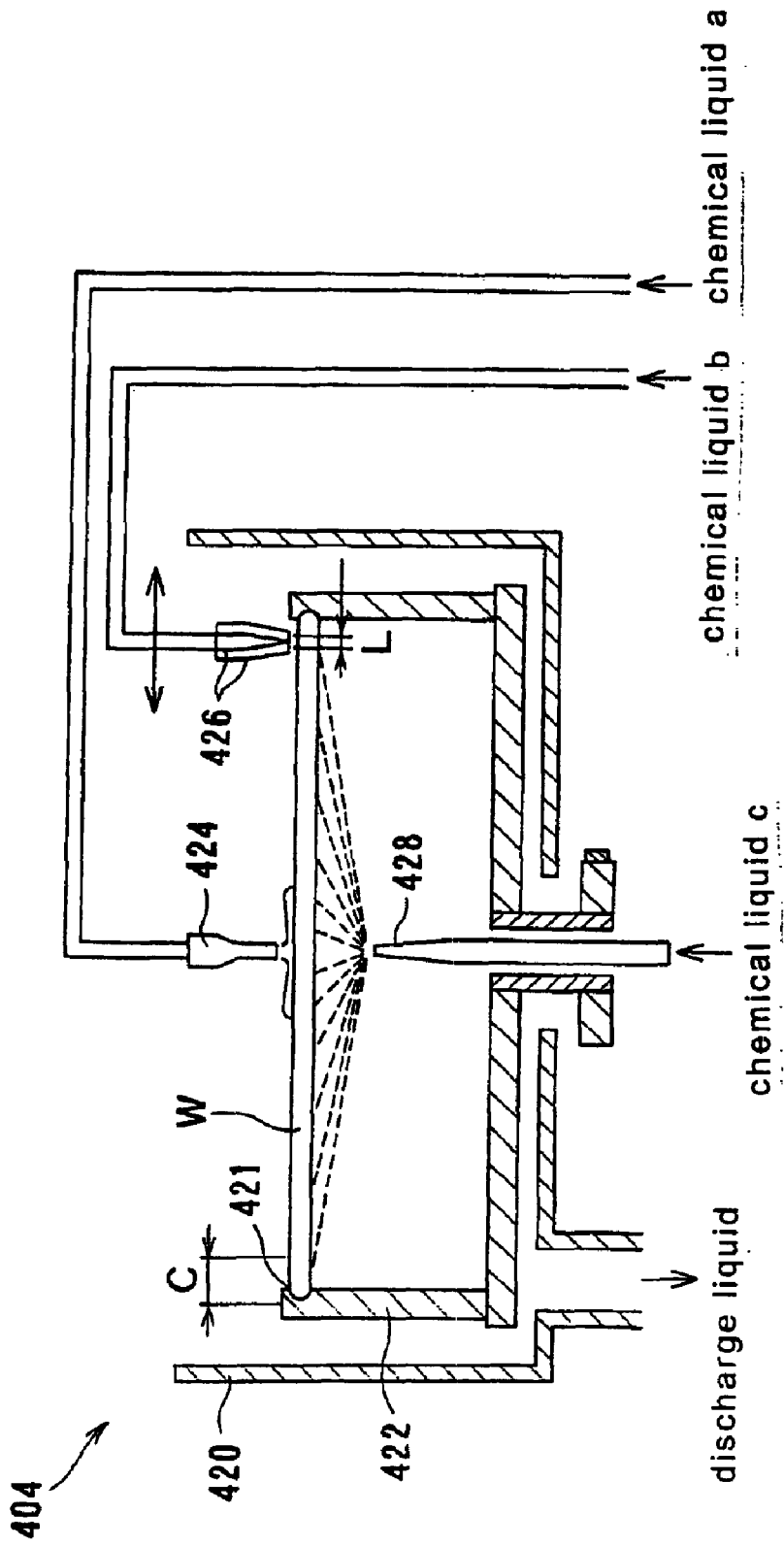
FIG. 18 is a cross-sectional view of a bevel/backside cleaning device.

The bevel/backside cleaning device 404 can simultaneously perform metal etching in the edge (bevel) portion and cleaning on the backside surface (lower surface) of the substrate, and can prevent a native oxide of copper from growing on the surface of the substrate on which a circuit is formed. FIG. 18 shows this bevel/backside cleaning device 404. The bevel/cleaning device 404 comprises a substrate holding portion 422 disposed in a bottomed cylindrical waterproof cover 420 for horizontally holding the substrate W with spin chucks 421 at a plurality of positions along the peripheral edge of the substrate in such a state that the surface of the substrate faces upwardly and rotating the substrate at a high rotational speed, a central nozzle 424 disposed above the central portion of the substrate W held by the substrate holding portion 422, and an edge nozzle 426 disposed above the peripheral portion of the substrate W. The central nozzle 424 and the edge nozzle 426 face downwardly, respectively. Further, a back nozzle 428 is disposed below an approximately central portion of the backside surface of the substrate W with facing upwardly. The back nozzle 428 is constituted so as to be movable in a radial direction and a vertical direction of the substrate W.

The movable width L of the edge nozzle 426 is such that the edge nozzle 426 can be positioned at desired positions from the peripheral end portion of the substrate to the central portion of the substrate, and a set point of the movable width L can be inputted according to the size of the substrate W, the intended purpose, and the like. Usually, an edge-cutting width C is predetermined within the range of 2 mm to 5 mm. A cooper film or the like can be removed within the range of the predetermined edge-cutting width C at rotational speeds that are as high as the amount of liquid flowing from the backside surface to the front surface can be negligible.

Next, a cleaning method with use of this cleaning device in an example of copper interconnections will be described below. The semiconductor substrate W is horizontally rotated together with the substrate holding portion 422 in such a state that the substrate is horizontally held via the spin chucks 421 by the substrate holding portion 422. In this state, an acid solution is supplied from the central nozzle 424 onto the central portion of the front surface of the substrate W. The acid solution may contain any non-oxidative acid, such as hydrofluoric acid, hydrochloric acid, sulfuric acid, citric acid, and oxalic acid. On the other hand, an oxidant solution is supplied onto the peripheral portion of the substrate W from the edge nozzle 426 continuously or intermittently. The oxidant solution may be an aqueous solution of ozone, hydrogen peroxide, nitric acid, or sodium hypochlorite, or a mixture thereof.

As a result, in the peripheral portion C of the semiconductor substrate W, the copper film or the like deposited on the front surface and the edge surface is rapidly oxidized by the oxidant solution, and simultaneously etched by the acid solution supplied from the central nozzle 424 and spreading over the surface of the substrate, so that the film is dissolved and removed. Thus, a steeper etching profile can be obtained by mixing the acid solution and the oxidant solution at the peripheral portion of the substrate, compared with cases where a premixed solution of these solutions is supplied from the nozzle. In this case, the etching rate of the copper is determined by the concentrations of the respective solutions. When a native oxide of copper has been formed on the surface of the substrate on which a circuit is formed, the native oxide is immediately removed by the acid solution spreading over the whole surface of the substrate due to the rotation of the substrate, so that the native oxide does not grow. The supply of the oxidant solution from the edge nozzle 426 is stopped after the supply of the acid solution from the central nozzle 424, and hence the silicon exposed to the surface can be oxidized to prevent the copper from attaching to the surface.

On the other hand, an oxidant solution and a silicon oxide etching agent are simultaneously or alternately supplied onto the central portion of the backside surface of the substrate W from the back nozzle 428. As a result, the metallic copper attached to the backside surface of the semiconductor substrate W, together with the silicon of the substrate, can be oxidized by the oxidant solution, and etched and removed by the silicon oxide etching agent. It is desirable that the same oxidant solution as supplied to the surface of the substrate is used as the oxidant solution, from the viewpoint of fewer kinds of chemicals used. Hydrofluoric acid may be used as the silicon oxide etching agent. When hydrofluoric acid is also used as the acid solution for the front surface of the substrate, the kinds of chemicals used can be decreased. When the supply of the oxidant solution is stopped earlier than the stopping of the supply of the etching agent solution, a hydrophobic surface can be obtained. When the supply of the etching agent solution is stopped earlier than the stopping of the supply of the oxidant solution, a hydrophilic surface can be obtained. Thus, the backside surface of the substrate can be adjusted to be a surface which is required by later processes.

As described above, the acid solutions, i.e., the etching liquids, are supplied onto the substrate to remove the metal ions remaining on the surface of the substrate W. Then, pure water is supplied onto the substrate to replace the etching liquids with the pure water and remove the etching liquids, and substrate W is spin-dried. The removal of the copper film within the range of the edge cutting width C in a peripheral portion of the front surface of the semiconductor substrate, and the removal of contaminant copper on the backside surface of the substrate can simultaneously be performed. This process can be completed in 80 seconds, for example. The edge cutting width in the etching process can be determined arbitrarily (2 mm–5 mm). However, the time required for the etching process does not depend on the cutting width.

EXAMPLE 1

Copper formate was used as a metallic salt, and 1-decanol was used as an organic compound. Copper formate of 10 g was thoroughly premixed with 1-decanol of 22 g. The mixture was then introduced in a two-neck flask of 500 ml. The contents of the flask were heated to 200° C. by a mantle heater while being agitated with the agitation rod 14. The reflux of the organic compound appeared at a temperature around 180° C., and the color of the solution began to change from green to brown at a temperature around 185° C. The solution was maintained at 200° C. for 15 minutes, and was then cooled. Precipitation and separation were carried out by acetone agglomeration and toluene dispersion. The ultrafine particles of copper covered with an organic compound thus obtained were observed with a scanning electron microscope. As a result, it was observed that the ultrafine particles each had a core metal portion having a size of 5 to 10 nm. Further, as a result of thermal analysis of the ultrafine particles, it was found that the metal content was 91% by weight. The ultrafine particles were dispersed in toluene to prepare a paste of 0.1 g/ml, and this paste was coated onto a glass substrate. The paste was baked in a nitrogen atmosphere at 300° C. to form a coating film of copper. Likewise, the paste may be coated onto a semiconductor substrate to form a coating film. The baking is carried out in an inert gas atmosphere under a reduced pressure of, for example, 10 Torr or lower, or even 1 Torr or lower. The baking temperature is preferably 200 to 350° C., and more preferably 250 to 300° C.

EXAMPLE 2

Silver carbonate was used as a metallic salt, and myristic acid was used as an organic compound. Silver carbonate of 10 g was reacted with myristic acid of 10 g under heating in the same manner as in Example 1, except that the temperature was raised by the mantle heater to 230° C. The reflux of the organic compound appeared at a temperature around 100° C., and the color of the solution began to change to brown at a temperature around 230° C. The solution was maintained at that temperature for 25 minutes. Separation and purification were carried out in the same manner as in Example 1. The ultrafine particles of silver covered with an organic compound thus obtained were observed with a scanning electron microscope. As a result, it was observed that the ultrafine particles each had a core metal portion having a size of 5 to 20 nm. Further, as a result of thermal analysis of the ultrafine particles, it was found that the metal content was 94% by weight. The ultrafine particles were dispersed in xylene to prepare a paste of 0.05 g/ml, and this paste was coated onto a polyimide. The paste was baked in air at 250° C. to form a coating film of silver. If possible, the paste is preferably baked in an inert gas atmosphere.

EXAMPLE 3

Stearyl alcohol was used as an organic compound including an alcoholic hydroxyl group, and silver carbonate was used as a metal source. These materials ground in a mortar were introduced into an eggplant-shaped flask having a volume of 1 liter. The contents of the flask were heated at 150° C. for one hour. In accordance with heating, the color tone was changed from light yellow to light brown and further to purple. At the same time that the color was changed to purple, bubbles were generated to cause volume expansion. After the completion of the reaction, acetone was added to carry out precipitation purification, and the precipitate thus obtained was then dispersed in toluene. The dispersion liquid was filtered for purification and air-dried.

This denatured powder was observed with a transmission electron microscope. As a result, it was observed that the powder was constituted by ultrafine particles having a particle diameter of about 5 to about 10 nm. Further, as a result of X-ray diffraction of the powder, a metallic core of silver was observed.

An absorption spectrum inherent in silver particles was obtained with an absorptiometer. Further, as a result of TG/DTA measurement, it was found that the content of silver was 80% by weight.

The powder of composite metallic ultrafine particles was dispersed in toluene and in xylene. In both of the cases, the dispersion liquids had no precipitate and were transparent. Specifically, it was found that the dispersion liquids were in a solubilized state.

The dispersion liquid as a composite metallic ultrafine particle dispersion liquid was coated onto the surface of a substrate at a rate of 0.05 g per 1 cm$^2$. The substrate was dried and heated in a nitrogen atmosphere at about 250° C. As a result, the substrate could easily be baked, and a coating film of silver was formed.

EXAMPLE 4

Phenol was used as an organic compound including an alcoholic hydroxyl group, and silver carbonate was used as a metal source. These materials ground in a mortar were introduced into an eggplant-shaped flask having a volume of 1 liter. The contents of the flask were heated at 180° C. for one hour. In accordance with heating, the color tone was changed from light yellow to light brown and further to purple. At the same time that the color was changed to purple, bubbles were generated to cause volume expansion. After the completion of the reaction, acetone was added to carry out precipitation purification, and the precipitate thus obtained was then dispersed in toluene. The dispersion liquid was filtered for purification and air-dried.

These metallic ultrafine particles were applied to a substrate in the same manner as in Example 3, except that the heating temperature was changed to 300° C. As a result, the substrate could easily be baked, and a coating film of silver was formed.

EXAMPLE 5

Lauryl alcohol was used as an organic compound including an alcoholic hydroxyl group, copper acetate was used as a metal source, and acetaldehyde was used as a reducing agent. These materials ground in a mortar were introduced into an eggplant-shaped flask having a volume of 1 liter. The contents of the flask were heated at 100° C. for one hour. In accordance with heating, the color tone was changed from blue to light brown and further to red. At the same time that the color was changed to red, bubbles were generated to cause volume expansion. After the completion of the reaction, acetone was added to carry out precipitation purification, and the precipitate thus obtained was then dispersed in toluene. The dispersion liquid was filtered for purification and air-dried.

This denatured powder was observed with a transmission electron microscope. As a result, it was observed that the powder was constituted by ultrafine particles having a particle diameter of about 10 to about 15 nm. Further, as a result of X-ray diffraction of the powder, a metallic core of copper was observed.

An absorption spectrum inherent in silver particles was obtained with an absorptiometer. Further, as a result of TG/DTA measurement, it was found that the content of silver was 85% by weight.

The powder of composite metallic ultrafine particles was dispersed in toluene and in xylene. In both of the cases, the dispersion liquids had no precipitate and were transparent. Specifically, it was found that the dispersion liquids were in a solubilized state.

The dispersion liquid as a composite metallic ultrafine particle dispersion liquid was coated onto the surface of a substrate at a rate of 0.05 g per 1 cm$^2$. The substrate was dried and heated in a nitrogen atmosphere at about 250° C. As a result, the substrate could easily be baked, and a coating film of silver was formed.

EXAMPLE 6

Ethylene glycol was used as an organic compound including an alcoholic hydroxyl group, and platinum chloride was used as a metal source. These materials ground in a mortar were introduced into an eggplant-shaped flask having a volume of 1 liter. The contents of the flask were heated at 180° C. for one hour. In accordance with heating, the color tone was changed from light yellow to light brown and further to gray. At the same time that the color was changed to gray, bubbles were generated to cause volume expansion. After the completion of the reaction, acetone was added to carry out precipitation purification, and the precipitate thus obtained was then dispersed in cyclohexane. The dispersion liquid was filtered for purification and air-dried.

These metallic ultrafine particles were applied to a substrate in the same manner as in Example 5, except that the heating temperature was changed to 300° C. As a result, the coating could easily be baked, and a coating film of platinum was formed.

EXAMPLE 7

Lauryl alcohol was used as an organic compound, and copper acetate was used as a metal source. Copper acetate was dissolved in acetone to prepare a solution having a concentration of 5 millimoles. Toluene of 500 ml, lauryl alcohol of 125 ml, and the copper acetate solution (a solution for composite metallic ultrafine particles) of 50 ml were introduced into an eggplant-shaped flask having a volume of 1 liter to form a precursor of ultrafine particles (an inverted micelle). L-ascorbic acid having a concentration of 11 millimoles and a volume of 75 ml, which was dissolved in ethanol, was added to the inverted micelle to reduce copper acetate contained in the inverted micelle. At that time, the contents of the flask were agitated with heating at the boiling temperature of toluene, 110° C. In accordance with agitating and heating, the color tone was changed from light green to light brown and further to reddish purple.

As a result of observation of an ultraviolet-visible absorption spectrum of the reddish purple solution, there was an absorption peak, inherent in a copper colloid, at about 570 nm, indicating that a copper colloid was synthesized.

This liquid was stable by virtue of the addition of the reducing agent, and was stable in a cool dark place for about one month. Filling of an inert gas can further increase the stability.

The copper colloid concentrated by centrifugal separation was dried and observed with scanning electron microscope. As a result, it was observed that the powder was constituted by ultrafine particles having a particle diameter of about 50 to about 60 nm. Further, as a result of X-ray diffraction of the powder, a metallic core of copper was observed. Furthermore, the content of the metal was measured with TG/DTA (thermogravimetric analysis-differential thermal analysis), and it was found that the content of the metal was about 80% by weight.

The powder of composite metallic ultrafine particles was dispersed in toluene and in xylene. In both of the cases, the dispersion liquids had no precipitate and were transparent. Specifically, it was found that the dispersion liquids were in a solubilized state.

The dispersion liquid as a composite metallic ultrafine particle dispersion liquid was coated onto the surface of a substrate at a rate of 0.05 g per 1 $cm^2$. The substrate was dried and heated in a nitrogen atmosphere at about 300° C. As a result, the substrate could easily be baked, and a coating film of copper was formed.

In this example, the amount (weight ratio) of hydrophilic nonaqueous solvent used was 5 to 40% with respect to the hydrophobic nonaqueous solvent, the amount (molar amount) of reducing agent added was 1 to 5 times that of the metallic salt, and the amount (weight ratio) of organic compound used was about 10 to 50% with respect to the hydrophobic nonaqueous solvent.

EXAMPLE 8

A surface-active agent was used as an organic compound, and copper acetate was used as a metal source. Copper acetate was dissolved in ethanol to prepare a solution having a concentration of 5 millimoles. Xylene of 500 ml, nonionic surface-active agent (sorbitan tristearate) of 50 ml, and the copper acetate solution of 50 ml were introduced into an eggplant-shaped flask having a volume of 1 liter to form a precursor of ultrafine particles (an inverted micelle). L-ascorbic acid having a concentration of 11 millimoles and a volume of 100 ml, which was dissolved in ethanol, was added to the inverted micelle. The contents of the flask were agitated with heating at the boiling temperature of xylene, i.e., 150° C., to reduce copper acetate contained in the inverted micelle. In accordance with agitating and heating, the color tone was changed from light green to light brown and further to reddish purple.

As a result of observation of an ultraviolet-visible absorption spectrum of the reddish purple solution, there was an absorption peak, inherent in a copper colloid, at about 570 nm, indicating that a copper colloid was synthesized.

This liquid was stable by virtue of the addition of the reducing agent, and was stable in a cool dark place for about one month. Filling of an inert gas can further increase the stability.

The composite metallic ultrafine particles were applied to a substrate in the same manner as in Example 7. The heating temperature in a nitrogen atmosphere was 300° C. As a result, the coating could easily be baked, and a coating film of copper was formed.

In this example, the amount (weight ratio) of hydrophilic nonaqueous solvent used was 5 to 40% with respect to the hydrophobic nonaqueous solvent, the amount (molar amount) of reducing agent added was 1 to 5 times that of the metallic salt, and the amount (weight ratio) of organic compound used was about 1 to about 30% with respect to the hydrophobic nonaqueous solvent.

What is claimed is:

1. A process for producing composite metallic ultrafine particles with a core metal covered by a protective layer comprising:
   a. Providing a metal source having a metallic component selected from the group consisting of metallic salts, metallic oxides, and metallic hydroxides;
   b. Providing an organic compound comprising 4–22 carbon atoms, wherein the organic compound has a functional group consisting of an alcoholic hydroxyl group;
   c. Mixing the metal source and the organic compound to form a mixture of the metal source and the organic compound; and
   d. Heating the mixture of the metal source and the organic compound to a temperature at which the metallic components in the metal source combine to form the core metal, and the alcoholic hydroxyl group of the organic compound becomes bonded to a surface of the core metal, thereby forming the core metal having a protective layer of an organic compound.

2. The process according to claim 1 wherein the core metal includes at least one member selected from the group consisting of Ag, Au, Bi, co, Cu, Cr, Fe, Ge, In, Ir, Ni, Os, Pd, Pt, Rh, Ru, Si, Sn, Ti and V.

3. The process according to claim 1 wherein the metal salt is selected from the group consisting of carbonates, nitrate, chlorides, acetates, formats, citrates, oxalates, urates, phthalates, and fatty acid salts that have no more than four carbon atoms.

4. The process according to claim 1 wherein the organic compound having a functional alcoholic hydroxyl group is a straight-chain or branched-chain alcohol or an aromatic compound having a hydroxyl group.

* * * * *

UNITED STATES PATENT AND TRADEMARK OFFICE
CERTIFICATE OF CORRECTION

PATENT NO. : 6,871,773 B2
DATED : March 29, 2005
INVENTOR(S) : Akira Fukunaga et al.

It is certified that error appears in the above-identified patent and that said Letters Patent is hereby corrected as shown below:

Column 30,
Line 47, delete "co" and insert therefor -- Co --.

Signed and Sealed this

Fifteenth Day of November, 2005

JON W. DUDAS
*Director of the United States Patent and Trademark Office*